(12) United States Patent
Dutta et al.

(10) Patent No.: US 8,902,668 B1
(45) Date of Patent: Dec. 2, 2014

(54) DOUBLE VERIFY METHOD WITH SOFT PROGRAMMING TO SUPPRESS READ NOISE

(71) Applicant: SanDisk Technologies Inc., Plano, TX (US)

(72) Inventors: Deepanshu Dutta, Santa Clara, CA (US); Ken Oowada, Fujisawa (JP); Genki Sano, Kanagawa (JP); Masaaki Higashitani, Cupertino, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/053,856

(22) Filed: Oct. 15, 2013

(51) Int. Cl.
*G11C 16/34* (2006.01)
*G11C 16/10* (2006.01)
*G11C 7/08* (2006.01)
*G11C 16/26* (2006.01)
*G11C 16/04* (2006.01)

(52) U.S. Cl.
CPC ............ *G11B 16/3459* (2013.01); *G11B 16/12* (2013.01); *G11C 7/08* (2013.01); *G11C 16/26* (2013.01); *G11C 16/3454* (2013.01); *G11C 16/0483* (2013.01); *G11C 16/10* (2013.01); *G11C 16/3436* (2013.01)
USPC ............ 365/185.22; 365/185.19; 365/185.28; 365/195; 365/196; 365/185.02

(58) Field of Classification Search
CPC ............... G11C 16/10; G11C 16/3459; G11C 16/0483; G11C 16/26; G11C 16/3454; G11C 16/3436
USPC ............ 365/185.22, 185.28, 195, 196, 185.2
See application file for complete search history.

(56) References Cited

U.S. PATENT DOCUMENTS

| | | | |
|---|---|---|---|
| 7,385,851 B1 | 6/2008 | Park et al. |
| 7,447,081 B2 | 11/2008 | Chan |
| 7,474,566 B2 | 1/2009 | Jung et al. |
| 8,000,150 B2 | 8/2011 | Seol et al. |
| 8,391,070 B2 | 3/2013 | Bathul et al. |
| 8,422,292 B2 | 4/2013 | Choi et al. |
| 8,446,776 B2 | 5/2013 | Hwang et al. |
| 8,451,663 B2 | 5/2013 | Lee |
| 8,472,257 B2 | 6/2013 | Dong et al. |
| 8,477,534 B2 | 7/2013 | Iwai et al. |
| 2008/0244162 A1 | 10/2008 | Mokhlesi et al. |
| 2013/0138882 A1 | 5/2013 | Shaeffer et al. |

OTHER PUBLICATIONS

U.S. Appl. No. 14/053,866, filed Oct. 15, 2013.

*Primary Examiner* — Ly D Pham
(74) *Attorney, Agent, or Firm* — Vierra Magen Marcus LLP

(57) ABSTRACT

Memory cells which have read noise are identified during a programming pass and an amount of programming is increased for noisy memory cells compared to non-noisy cells. The read noise is indicated by a decrease in the threshold voltage of a cell when the cell is repeatedly read. During the programming pass, a cell enters a temporary lockout state when it passes a first verify test. In this state, the cell is subject to one or more additional verify tests. If the one or more additional verify tests indicate that the threshold voltage of a cell has decreased, the cell is noisy and is soft programmed before being permanently locked out. In contrast, programming of a non-noisy cell is concluded after the first verify test without further programming.

22 Claims, 21 Drawing Sheets

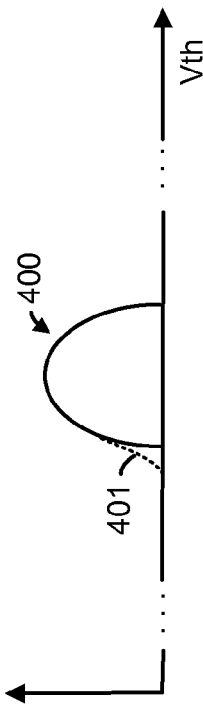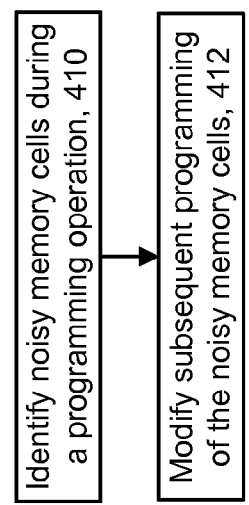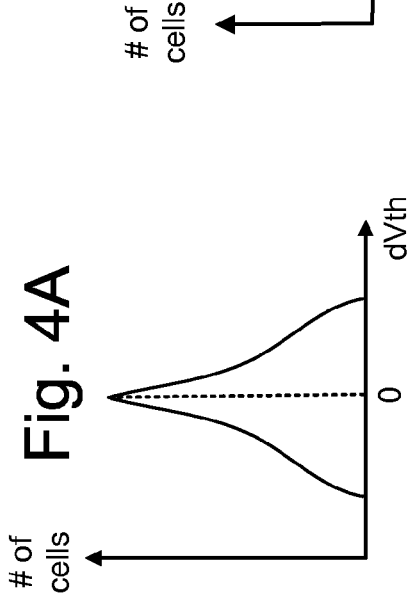

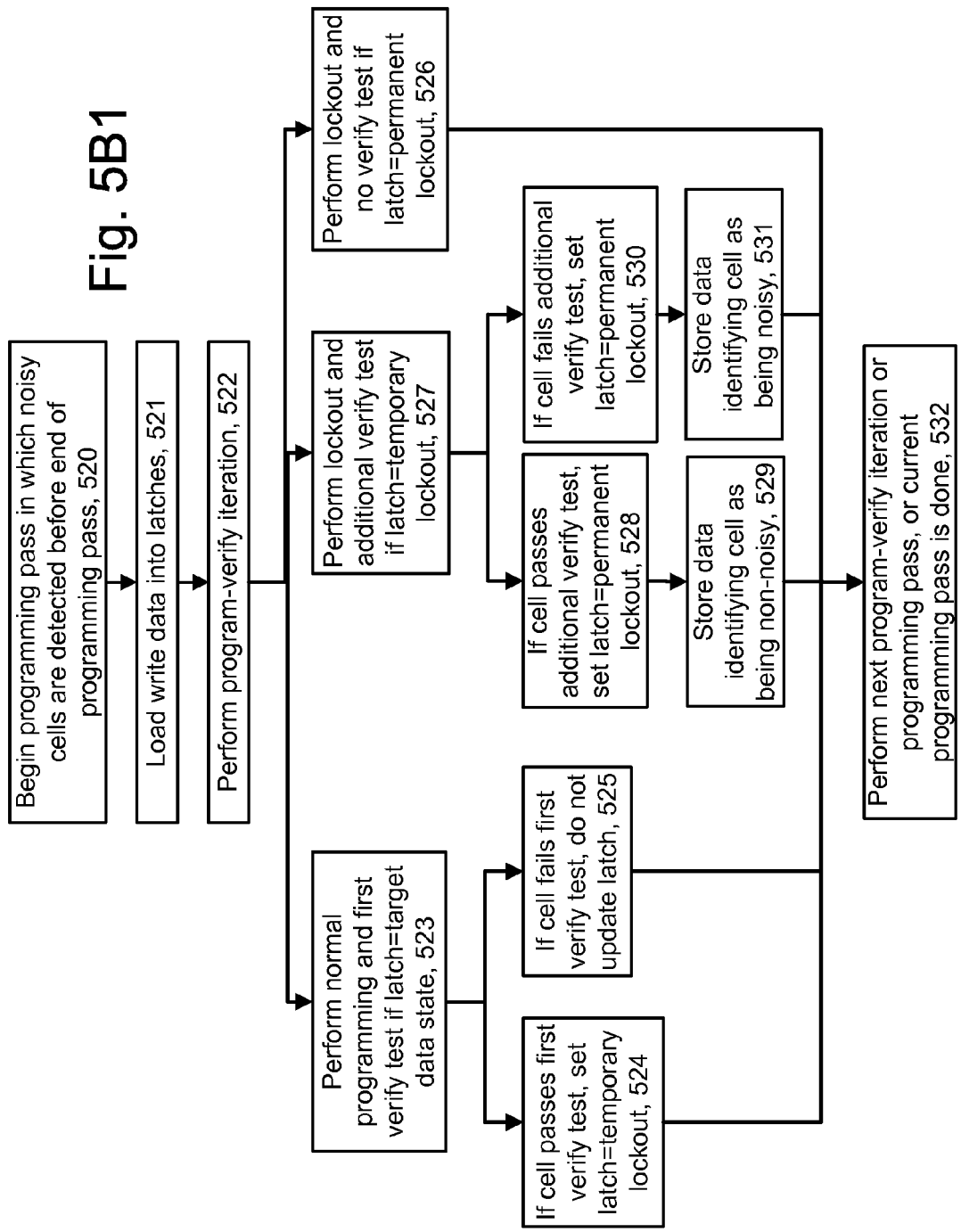
Fig. 5B1

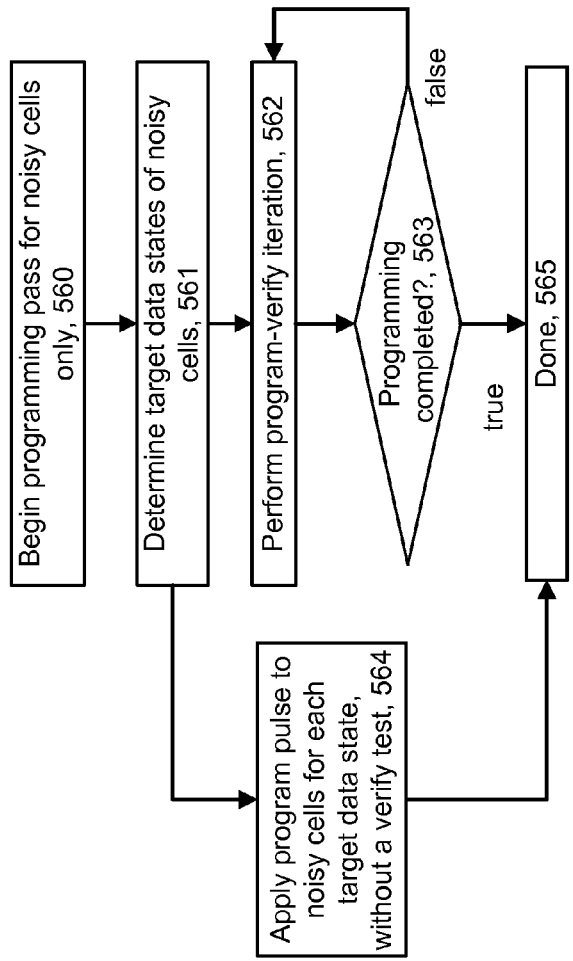
Fig. 5B3
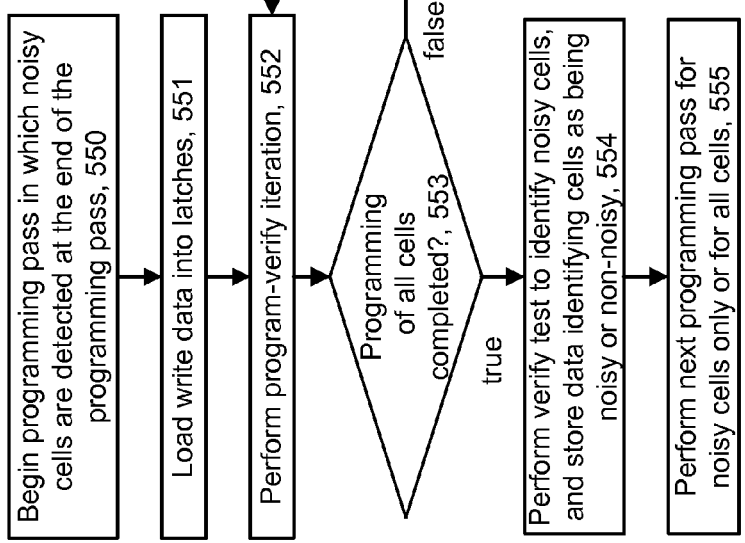
Fig. 5B2

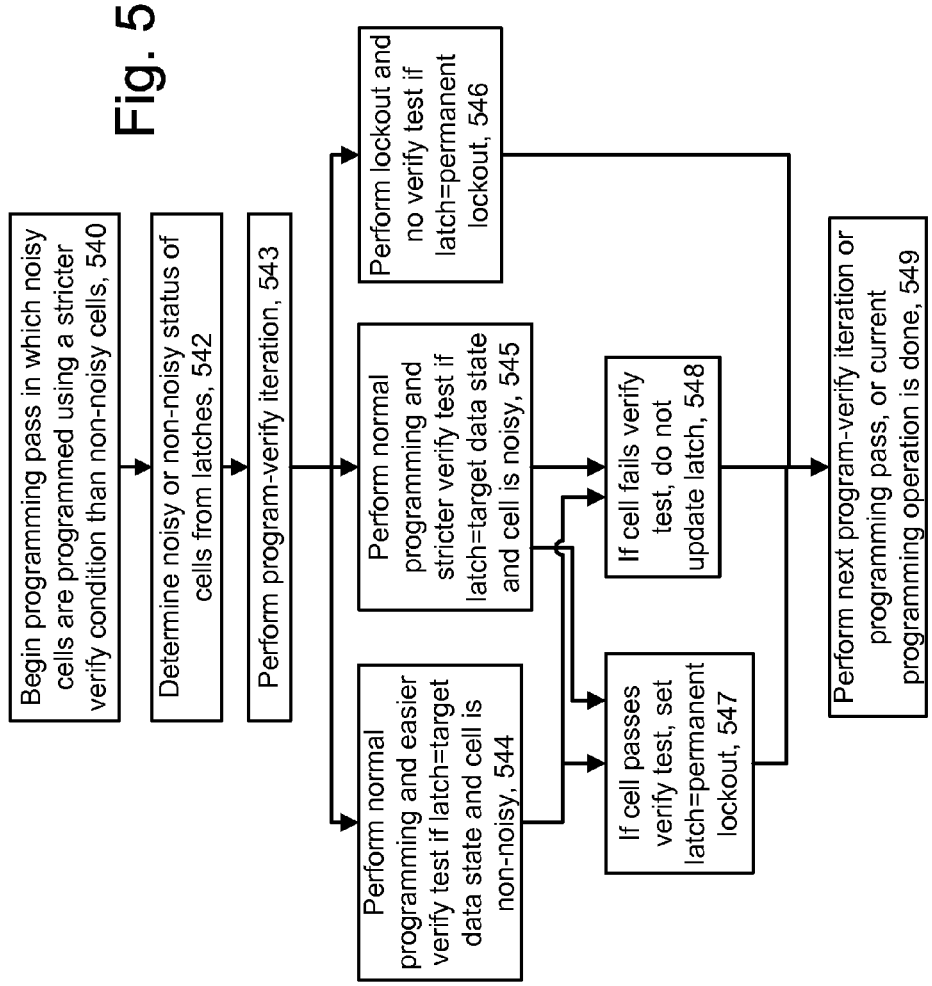

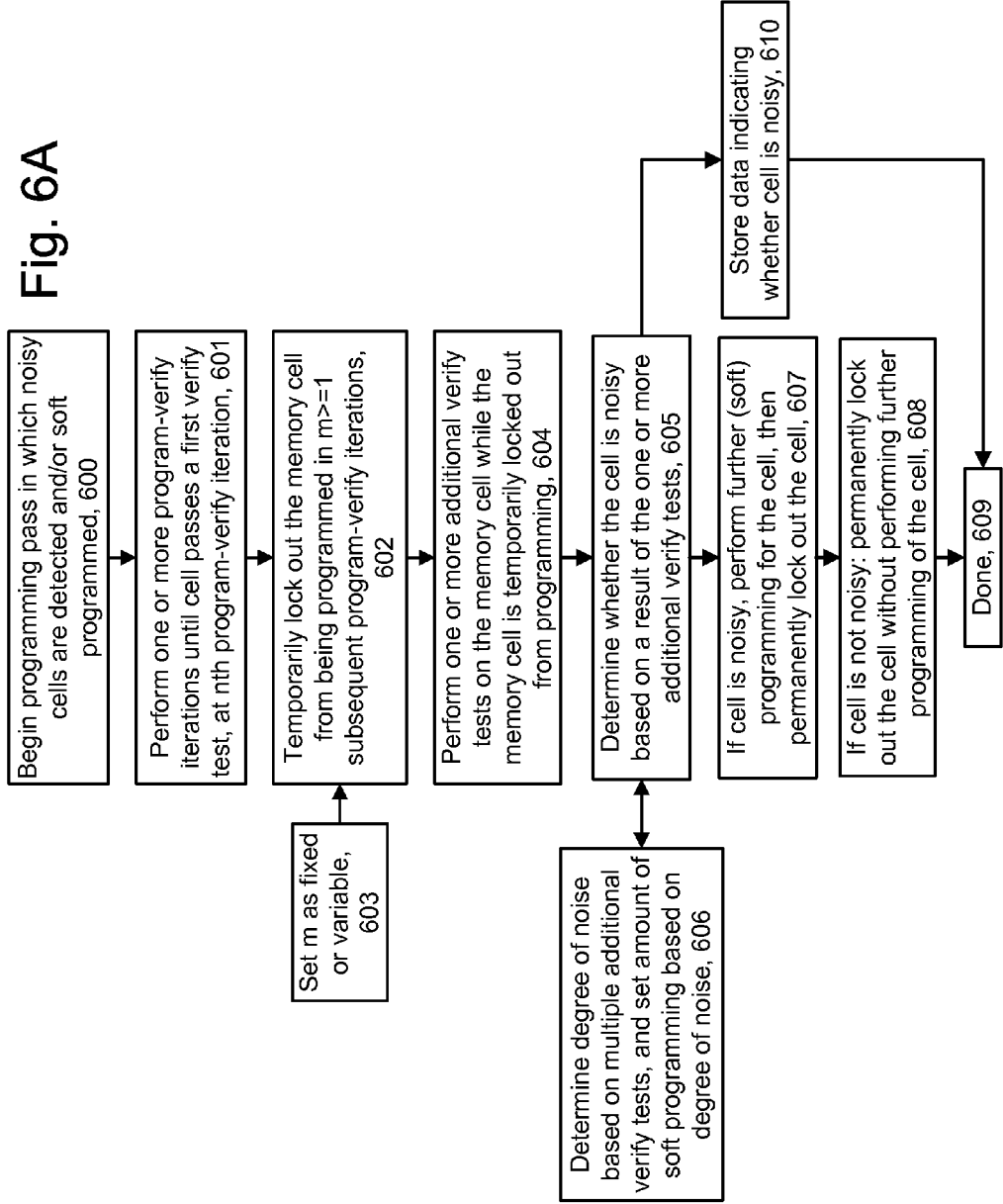

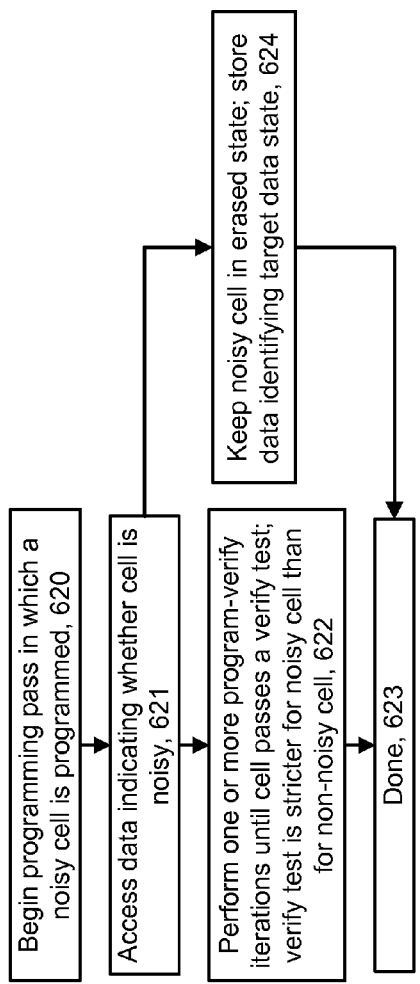
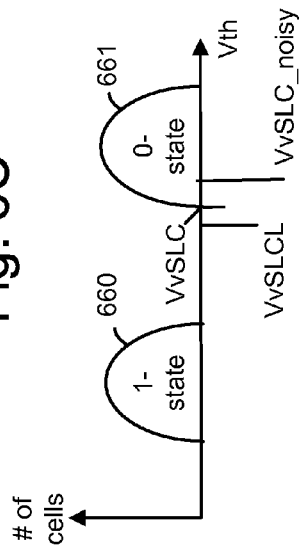

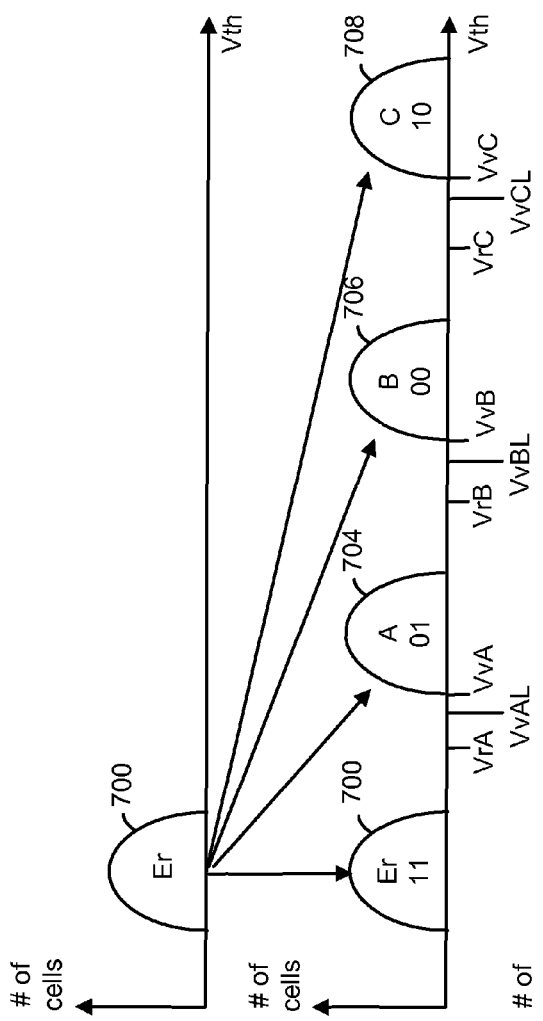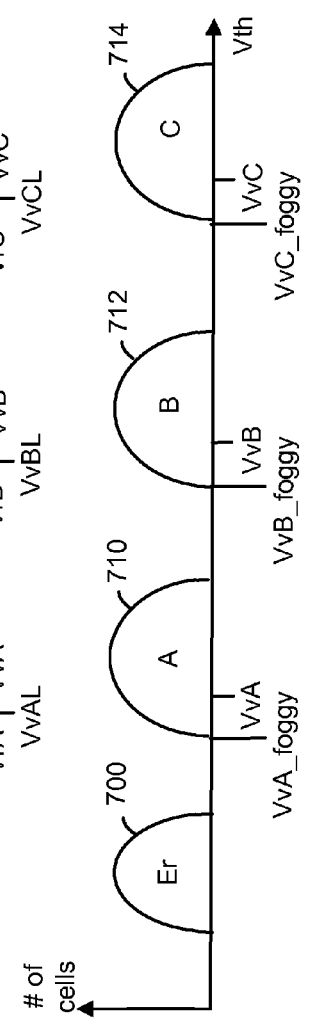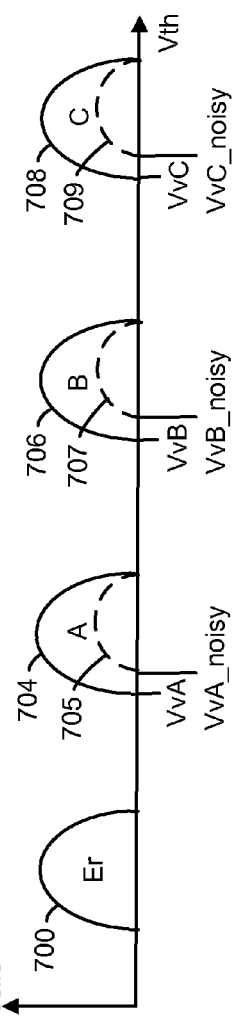

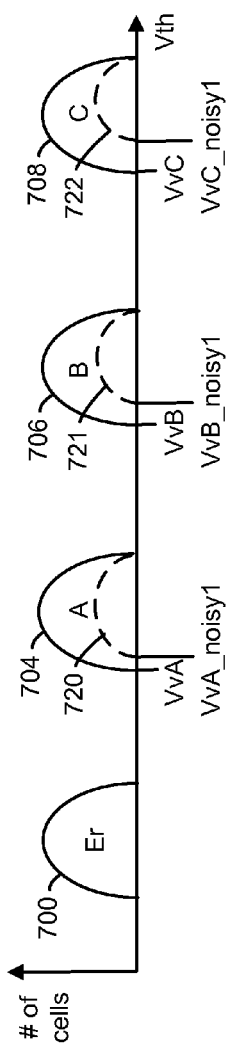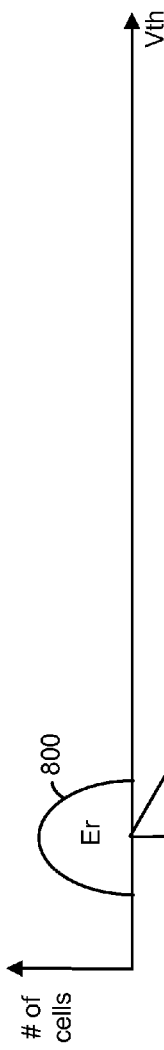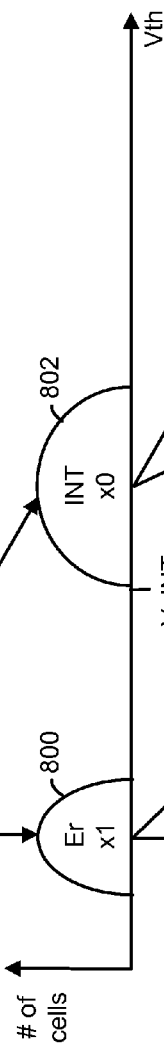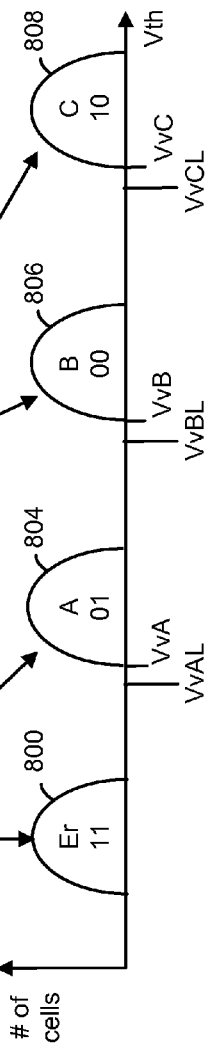

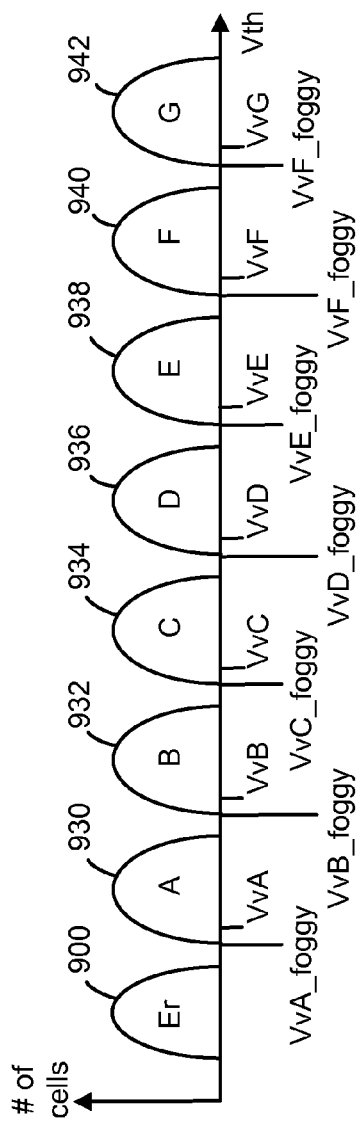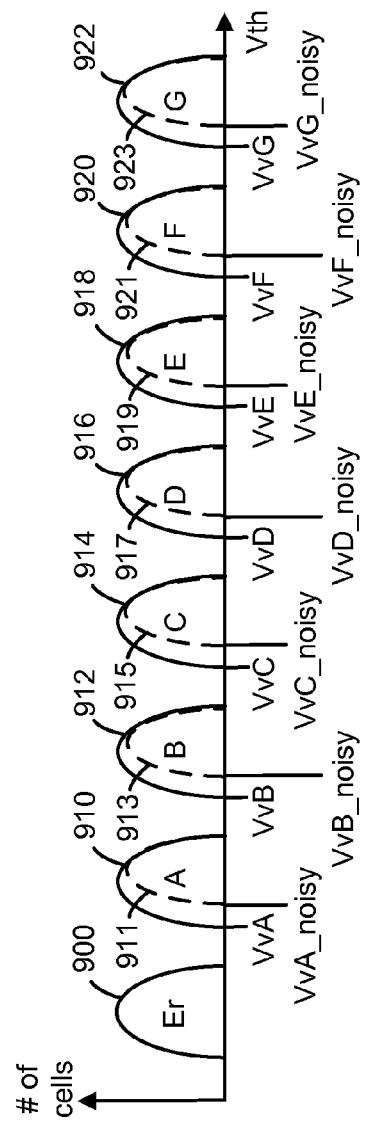

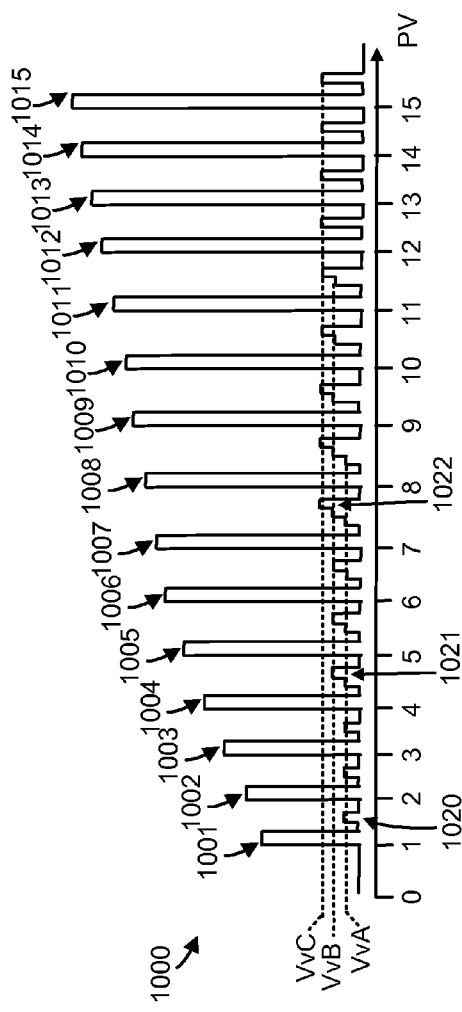
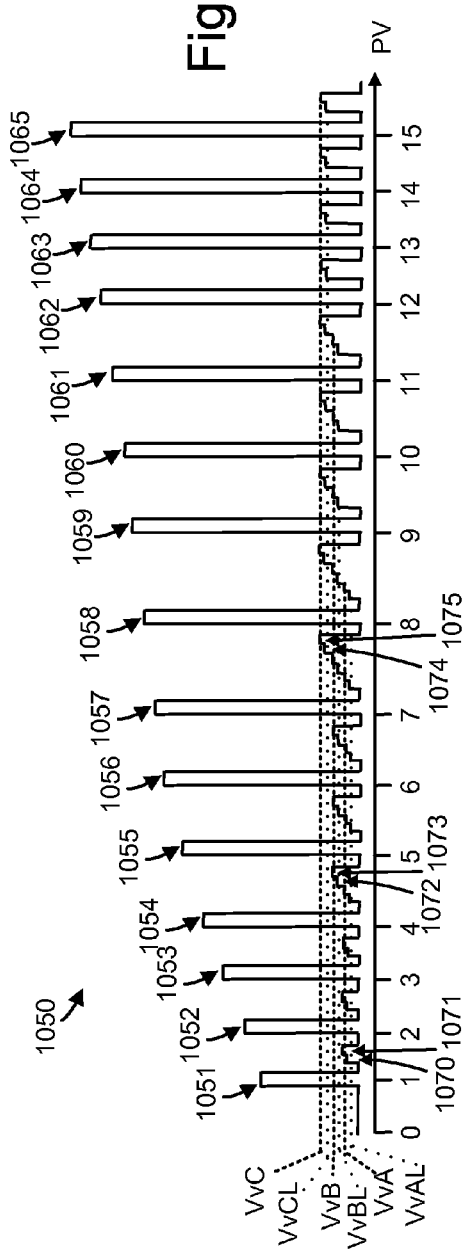

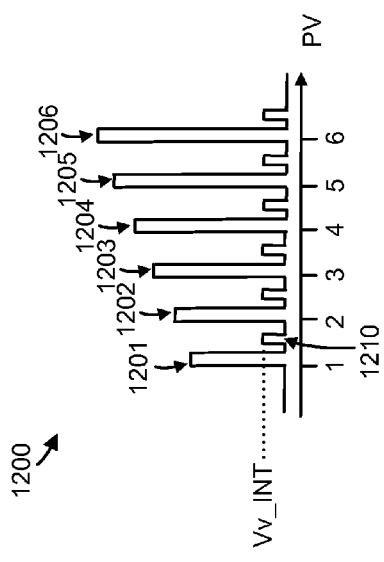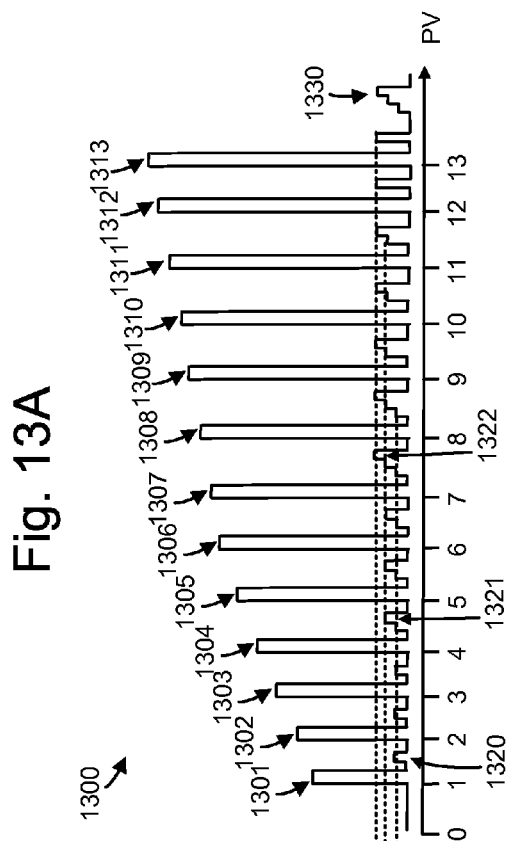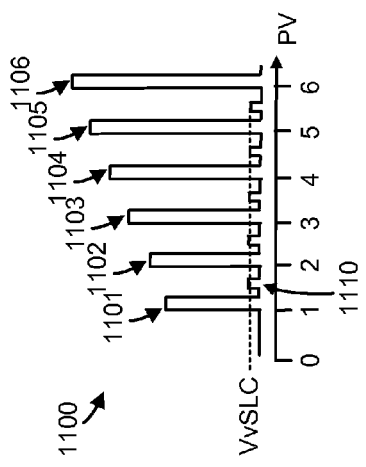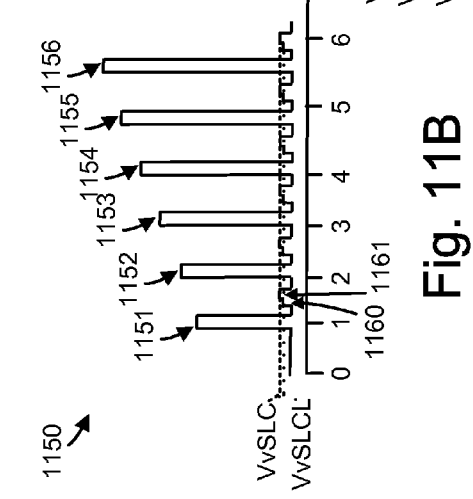

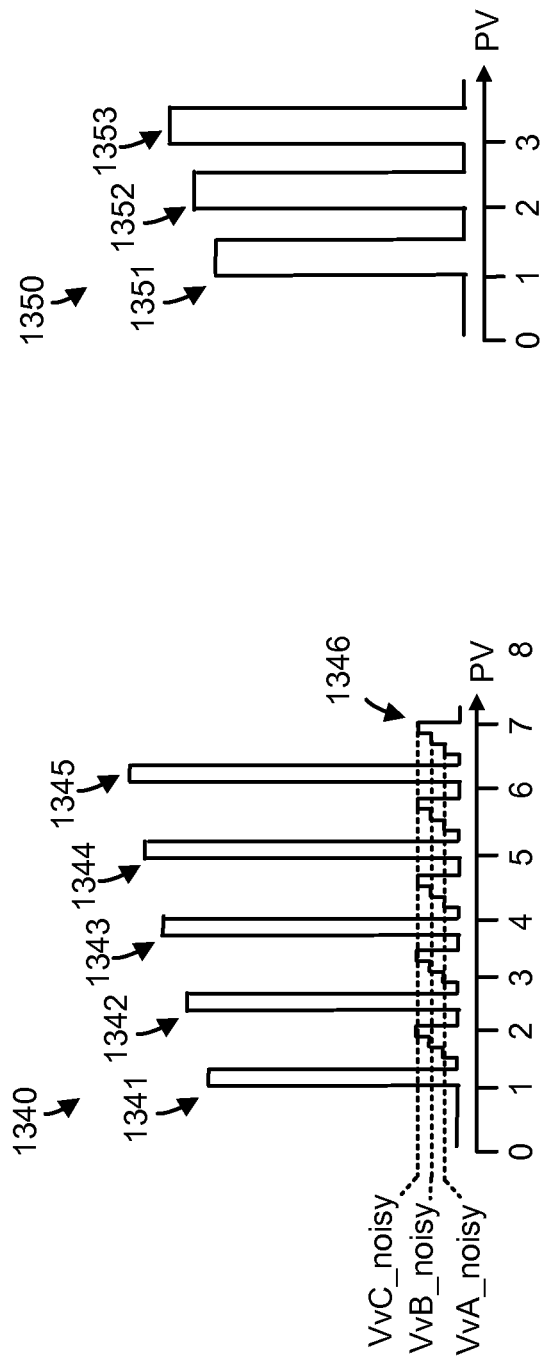

Fig. 16A

| Latch: | C0 Er | C1 An | C2 Ag | C0 Apl | C3 Bn | C4 Bg | C0 Bpl | C5 Cn | C0 Cpl | C6 Csp | C7 Ctl |
|---|---|---|---|---|---|---|---|---|---|---|---|
| QPW (QDL) | 1 | 0 | 0 | 1 | 0 | 1 | 1 | 0 | 1 | 0 | 1 |
| Upper page (UDL) | 1 | 1 | 1 | 1 | 0 | 0 | 1 | 1 | 1 | 1 | 1 |
| Lower page (LDL) | 1 | 1 | 1 | 1 | 0 | 0 | 1 | 0 | 1 | 0 | 0 |

Fig. 16B

| Latch: | C0 Er | C1 An | C0 Apl | C2 Bsp | C3 Bn | C4 Btl | C0 Bpl | C5 Cn | C0 Cpl | C6 Csp | C7 Ctl |
|---|---|---|---|---|---|---|---|---|---|---|---|
| QPW (QDL) | 1 | 0 | 1 | 0 | 0 | 1 | 1 | 0 | 1 | 0 | 1 |
| Upper page (UDL) | 1 | 1 | 1 | 0 | 0 | 0 | 1 | 1 | 1 | 1 | 1 |
| Lower page (LDL) | 1 | 1 | 1 | 1 | 0 | 0 | 1 | 0 | 1 | 0 | 0 |

Fig. 16C

| Latch: | C0 Er | C1 Apl1 | C0 Apl2 | C2 Bpl1_noisy | C3 Bn | C4 Bpl1_non-noisy | C0 Bpl2 | C5 Cn | C0 Cpl | C6 Cpl_noisy | C7 Cpl_non-noisy | C0 Cpl2 |
|---|---|---|---|---|---|---|---|---|---|---|---|---|
| QPW (QDL) | 1 | 0 | 1 | 0 | 0 | 1 | 1 | 0 | 1 | 0 | 1 | 1 |
| Upper page (UDL) | 1 | 1 | 1 | 1 | 0 | 0 | 1 | 1 | 1 | 1 | 1 | 1 |
| Lower page (LDL) | 1 | 1 | 1 | 1 | 0 | 0 | 1 | 0 | 1 | 0 | 0 | 1 |

Fig. 17A

| Latch: | Er | A | B | C |
|---|---|---|---|---|
| QDL | 1 | 0 | 0 | 0 |
| UDL | 1 | 0 | 0 | 1 |
| LDL | 1 | 1 | 0 | 0 |

Fig. 17B

| Latch: | Er | A | B | C |
|---|---|---|---|---|
| QDL | 1 | 1 | 0 | 0 |
| UDL | 1 | 0 | 0 | 1 |
| LDL | 1 | 1 | 0 | 0 |

Fig. 17C

| Latch: | Er | A | B | C |
|---|---|---|---|---|
| QDL | 1 | 1 | 0 | 0 |
| UDL | 1 | 1 | 0 | 1 |
| LDL | 1 | 1 | 0 | 0 |

Fig. 17D

| Latch: | Er | A | B | C |
|---|---|---|---|---|
| QDL | 1 | 1 | 1 | 0 |
| UDL | 1 | 1 | 0 | 1 |
| LDL | 1 | 1 | 0 | 0 |

Fig. 17E

| Latch: | Er | A | B | C |
|---|---|---|---|---|
| QDL | 1 | 1 | 1 | 0 |
| UDL | 1 | 1 | 1 | 1 |
| LDL | 1 | 1 | 1 | 0 |

Fig. 17F

| Latch: | Er | A | B | C |
|---|---|---|---|---|
| QDL | 1 | 1 | 1 | 1 |
| UDL | 1 | 1 | 1 | 1 |
| LDL | 1 | 1 | 1 | 1 |

Fig. 17G

| Latch: | Er | A | B | C |
|---|---|---|---|---|
| QDL | 1 | 1 | 1 | 1 |
| UDL | 1 | 1 | 1 | 1 |
| LDL | 1 | 1 | 1 | 0 |

Fig. 17H

| Latch: | Er | A | B | C |
|---|---|---|---|---|
| QDL | 1 | 1 | 1 | 1 |
| UDL | 1 | 1 | 1 | 1 |
| LDL | 1 | 1 | 1 | 1 |

Fig. 17I

| Latch: | Er | A | B | C |
|---|---|---|---|---|
| QDL | 1 | 1 | 0 | 1 |
| UDL | 1 | 1 | 1 | 1 |
| LDL | 1 | 1 | 1 | 1 |

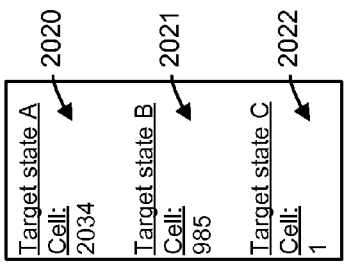

Fig. 20A

Receive write data, 2000 → Obtain noise status of cells involved in write, 2001 → Modify write data to convert data for noisy cells from their original target data state to the erased state, 2002

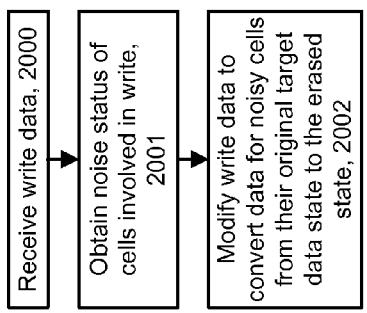

Fig. 20B

Read cells, 2010 → Obtain noise status of cells involved in read, 2011 → Modify read data to convert data from noisy cells from erased state to the original state, 2012

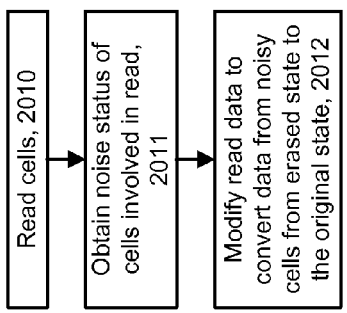

Fig. 20C

Target state A
Cell:
2034 — 2020

Target state B
Cell:
985 — 2021

Target state C
Cell:
1 — 2022

Fig. 18A

Latch: 1-state 0-state
UDL      1       0
LDL

Fig. 18B

Latch: 1-state 0-state
UDL      1       1
LDL

Fig. 19A

Latch: 1-state 0-state
UDL      1       1
LDL      1       0

Fig. 19B

Latch: 1-state 0-state
UDL      1       0
LDL      1       0

Fig. 19C

Latch: 1-state 0-state
UDL      1       1
LDL      1       1

Fig. 19D

Latch: 1-state 0-state
UDL      1       0
LDL      1       1

DOUBLE VERIFY METHOD WITH SOFT PROGRAMMING TO SUPPRESS READ NOISE

BACKGROUND

The present technology relates to non-volatile memory.

Semiconductor memory devices have become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories.

In such memory devices, a memory cell can include a floating gate that is positioned above and insulated from a channel region in a semiconductor substrate, in a two-dimensional (2D) NAND configuration. The floating gate is positioned between source and drain regions. A control gate is provided over and insulated from the floating gate. The threshold voltage (Vth) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

A memory cell can have a floating gate that is used to store two or more ranges of charges, where each range represents a data state.

Moreover, ultra high density storage devices have been proposed using a 3D stacked memory structure which is formed from an array of alternating conductive and dielectric layers. One example is the Bit Cost Scalable (BiCS) architecture. A memory hole is drilled in the layers, and a NAND string is formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

Techniques are need for accurately programming a memory device.

BRIEF DESCRIPTION OF THE DRAWINGS

FIG. 4A depicts a distribution of read noise for a set of memory cells.

FIG. 4B depicts a programmed Vth distribution 400 of a target data state, showing a lower tail 401 of the distribution which is caused by read noise.

FIG. 4C depicts a programming process which identifies, and modifies programming for, noisy cells in a set of memory cells.

FIG. 5B1 depicts an example of a programming pass in which noisy cells are detected but not soft programmed, where the detection occurs before the end of the programming pass.

FIG. 5B2 depicts another example of a programming pass in which noisy cells are detected but not soft programmed, where the detection occurs at the end of the programming pass.

FIG. 5B3 depicts an example process for programming noisy cells only.

FIG. 5C depicts an example of a programming pass in which noisy cells are programmed using a stricter verify test than non-noisy cells.

FIG. 6A depicts an example of a single programming pass in which an individual noisy cell is detected and/or soft programmed FIG. 6B depicts an example of a programming pass in which an individual noisy cell is programmed.

FIG. 6C depicts threshold voltage (Vth) distributions and verify levels for programming using binary data.

FIGS. 7A and 7B depict Vth distributions in a single pass programming operation which uses four data states, where FIG. 7A depicts an erased (Er) state Vth distribution 700, and FIG. 7B depicts Vth distributions 700, 704, 706 and 708 after programming following the Vth distribution of FIG. 7A.

FIG. 7C depicts Vth distributions after programming using foggy verify levels following the Vth distribution of FIG. 7A, as an alternative to FIG. 7B.

FIG. 7D depicts Vth distributions after programming using fine verify levels for noisy and non-noisy cells following the Vth distribution of FIG. 7C.

FIG. 7E depicts an alternative to FIG. 7D in which the verify strictness is a function of target data state.

FIG. 8A to 8C depict a two-pass programming operation with four data states, where FIG. 8A depicts the Er state, FIG. 8B depicts the Er and INT states and FIG. 8C depicts the Er, A, B and C states.

FIG. 9A depicts the Er state, FIG. 9B depicts the Er and INT states, FIG. 9C depicts the Er and INT1-INT3 states, and FIG. 9D depicts the Er and A-G states.

FIG. 9E depicts Vth distributions after programming using foggy verify levels following the Vth distribution of FIG. 9C, as an alternative to FIG. 9D.

FIG. 9F depicts Vth distributions after programming using fine verify levels for noisy and non-noisy cells following the Vth distribution of FIG. 9E.

FIG. 10A depicts program-verify iterations in an example of a single programming pass in which four data states are used, consistent with FIGS. 7A and 7B.

FIG. 10B depicts program-verify iterations in an alternative to FIG. 10A, where quick pass write (QPW) verify levels are used, consistent with FIGS. 7A and 7B.

FIG. 11A depicts program-verify iterations in an example of a single programming pass in which two data states are used, consistent with FIG. 6C.

FIG. 11B depicts program-verify iterations in an alternative to FIG. 11A, where the QPW verify levels of FIG. 6C are used.

FIG. 12 depicts program-verify iterations in an example of a programming pass for a lower page of data, consistent with FIG. 8B.

FIG. 13A depicts program-verify iterations in an example of a foggy programming pass, consistent with FIG. 7C.

FIG. 13B depicts program-verify iterations in an example of additional programming for noisy cells only.

FIG. 13C depicts program pulses in an example of additional programming for noisy cells only.

FIG. 16A depicts an example arrangement of bit combinations in data latches, where there are four data states, and two previously unused bit combinations C6 and C7 are used to identify a soft programming mode (Csp) and a temporary lockout mode (Ctl), respectively, for a C-state memory cell.

FIG. 16B depicts an example arrangement of bit combinations in data latches, where the bit combinations C2 and C4 of FIG. 16A are used to identify a soft programming mode (Bsp) and a temporary lockout mode (Btl), respectively, for a B-state memory cell.

FIG. 16C depicts an example arrangement of bit combinations in data latches, where the bit combinations C2, C4, C6 and C7 of FIG. 16A are used to identify a B-state noisy cell, a B-state non-noisy cell, a C-state noisy cell and a C-state non-noisy cell, respectively.

FIG. 17A-17E depict bit combinations in data latches during a programming operation involving four data states, up to completion of the B-state programming, where FIG. 17A depicts bit combinations at the start of a programming pass, FIG. 17B depicts the bit combinations of FIG. 17A after the A-state cells pass the VvAL verify level, FIG. 17C depicts the bit combinations of FIG. 17B after the A-state cells pass the VvA verify level, FIG. 17D depicts the bit combinations of FIG. 17C after the B-state cells pass the VvBL verify level, and FIG. 17E depicts the bit combinations of FIG. 17D after the B-state cells pass the VvB verify level.

FIG. 17F depicts one option for the bit combinations in the data latches after completion of the C-state programming, following FIG. 17E, where a same bit combination (C0 from FIG. 16A) is used for an inhibit mode for all data states, as a comparative example.

FIG. 17G depicts another option for the bit combinations in the data latches after a C-state memory cell passes a first verify test, following FIG. 17E, where a first bit combination (C7 from FIG. 16A) is used to set a temporary lockout mode for a C-state cell.

FIG. 17H depicts an option for the bit combinations in the data latches after a C-state memory cell passes an additional verify test, or after soft programming is performed, where a second bit combination (C0 from FIG. 16A) is used to set a permanent lockout mode for the C-state cell.

FIG. 17I depicts an option for the bit combinations in the data latches after a C-state memory cell fails an additional verify test, where a third bit combination (C6 from FIG. 16A) is used to set a soft programming mode for the C-state cell, following FIG. 17G.

FIGS. 18A and 18B depict bit values in data latches during a programming operation involving two data states, where two bit values are used, as a comparative example, consistent with FIG. 6C, where FIG. 18A provides original write data at a start of a programming operation and FIG. 18B depicts the bit combinations of FIG. 18A after the 0-state cells pass the VvSLC verify level.

FIG. 19A depicts bit combinations in data latches at a start of a programming operation involving two data states, where one bit combination identifies a memory cell which is to remain in the 1-state and another bit combination identifies a memory cell which is to be programmed to the 0-state.

FIG. 19B depicts bit combinations in data latches after a 0-state memory cell passes a first verify test, following FIG. 19A, where a first bit combination is used to set a temporary lockout mode for the memory cell.

FIG. 19C depicts bit combinations in data latches after a 0-state memory cell passes an additional verify test, following FIG. 19B, where a second bit combination is used to set a permanent lockout mode for the 0-state cell.

FIG. 19D depicts bit combinations in data latches after a 0-state memory cell fails the additional verify test, following FIG. 19B, where a third bit combination is used to set a soft programming mode for the 0-state cell.

FIG. 20A depicts a process for modifying write data so that noisy cells remain in an erased state.

FIG. 20B depicts a process for modifying read data from noisy cells.

FIG. 20C provides tables which identify cells for which the data is modified.

DETAILED DESCRIPTION

Figure 1:
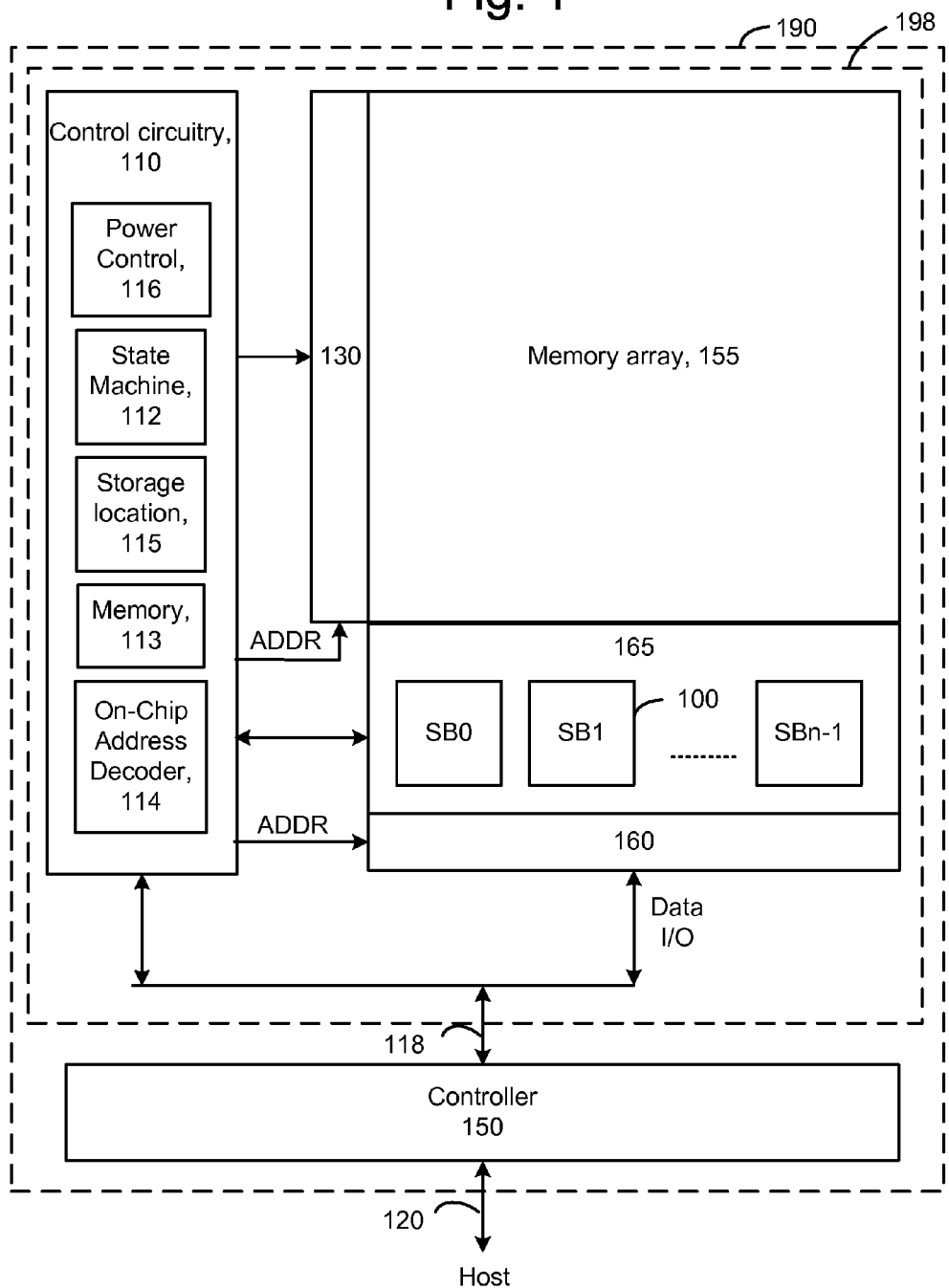
FIG. 1 is a block diagram of a non-volatile memory system using single row/column decoders and read/write circuits.

Programming techniques and a corresponding memory device are provided which address the effects of read noise during programming During an iterative programming operation, program-verify iterations are performed until the threshold voltage (Vth) of a memory cell is determined to exceed a verify level, in a verify test. This determination is made by sensing whether the memory cell is in a conductive or non-conductive state. However, due to noise effects, the Vth can increase or decrease after the memory cell has passed the verify test a first time. A significant decrease in the Vth can be problematic as it can lead to an error when the memory cell is later read.

Techniques provided herein address the above and other issues by distinguishing memory cells which are noisy from other memory cells, referred to as non-noisy memory cells, during a programming operation. Subsequently, the programming of the noisy memory cells is modified so that the noisy cells are subject to additional programming. In one approach, after a memory cell passes a first verify test, the memory cell is subjected to one or more additional verify tests. If the memory cell passes the one or more additional verify tests, it is considered to be a non-noisy cell. However, if the memory cell fails the one or more additional verify tests, it is considered to be a noisy cell and is subjected to additional programming. The additional programming can be a relatively small amount of programming referred to as soft programming and is intended to increase the Vth back above the verify level. For example, the memory cell may be subject to one additional program pulse while the bit line voltage is elevated to reduce the programming effect of the program pulse. The verify tests and the additional programming can occur in one programming pass, for example. The one additional program pulse does not increase the programming time because it is used for programming other cells which have not passed a first verify test.

In another approach, the verify tests and the additional programming can occur in separate programming passes. For example, the verify tests can occur in a first programming pass to identify the noisy and non-noisy memory cells while programming the Vth of the memory cells toward the final verify levels. Data latches associated with each memory cell are used to store data indicating whether the memory cells are noisy or non-noisy. Subsequently, in a later programming pass, the data latches are read to identify the noisy or non-noisy status of each memory cell, and the programming is adjusted such as by making the verify test stricter for the noisy memory cells. In this approach, the noisy cells are programmed to a slightly higher Vth than the non-noisy cells as a precaution against a potential subsequent decrease in the Vth due to noise, so that the Vth will likely be above the normal verify level even if a decrease in the Vth occurs.

In another approach, a controller can use the information which identifies the noisy cells for different purposes. For example, the data latches can be set so that most noisy cells are targeted to the erased state during programming. Read noise which results in a decrease in the Vth of a cell is less of an issue when the cell is in the erased state, because it does not reduce the ability to distinguish the cell from an A-state cell.

Advantages include achieving narrower Vth distributions during programming and reducing or avoiding read errors due to read noise. Additionally, there is little or no extra cost in terms of programming time and overhead data requirements.

An example memory system which can be used is discussed next. Generally, any type of non-volatile memory can be used. A memory with NAND strings is an example only.

FIG. 1 is a block diagram of a non-volatile memory system using single row/column decoders and read/write circuits. The diagram illustrates a memory device 190 having read/write circuits for reading and programming a page of memory cells in parallel, according to one embodiment. Memory device 190 may include one or more memory die 198. Memory die 198 includes a two-dimensional memory array 155 of memory cells or storage elements, control circuitry 110, and read/write circuits 165.

In some embodiments, the array of memory cells can be three dimensional. The memory array 155 is addressable by word lines via a row decoder 130 and by bit lines via a column decoder 160. The read/write circuits 165 include multiple sense blocks 100 and allow a page of memory cells to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory array 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

A storage location 115 such as a data register can be used to store data which identifies cells as being noisy or non-noisy.

One or more of the components (alone or in combination), other than memory array 155, can be thought of as a managing or control circuit. For example, one or more control circuits may include any one of, or a combination of, control circuitry 110, state machine 112, decoders 114/160, power control module 116, sense blocks 100 (including the processor 192 and managing circuit MC0 in FIG. 3), read/write circuits 165, and controller 150, and so forth. The sense block 100 is discussed further in connection with FIG. 3.

Figure 2:
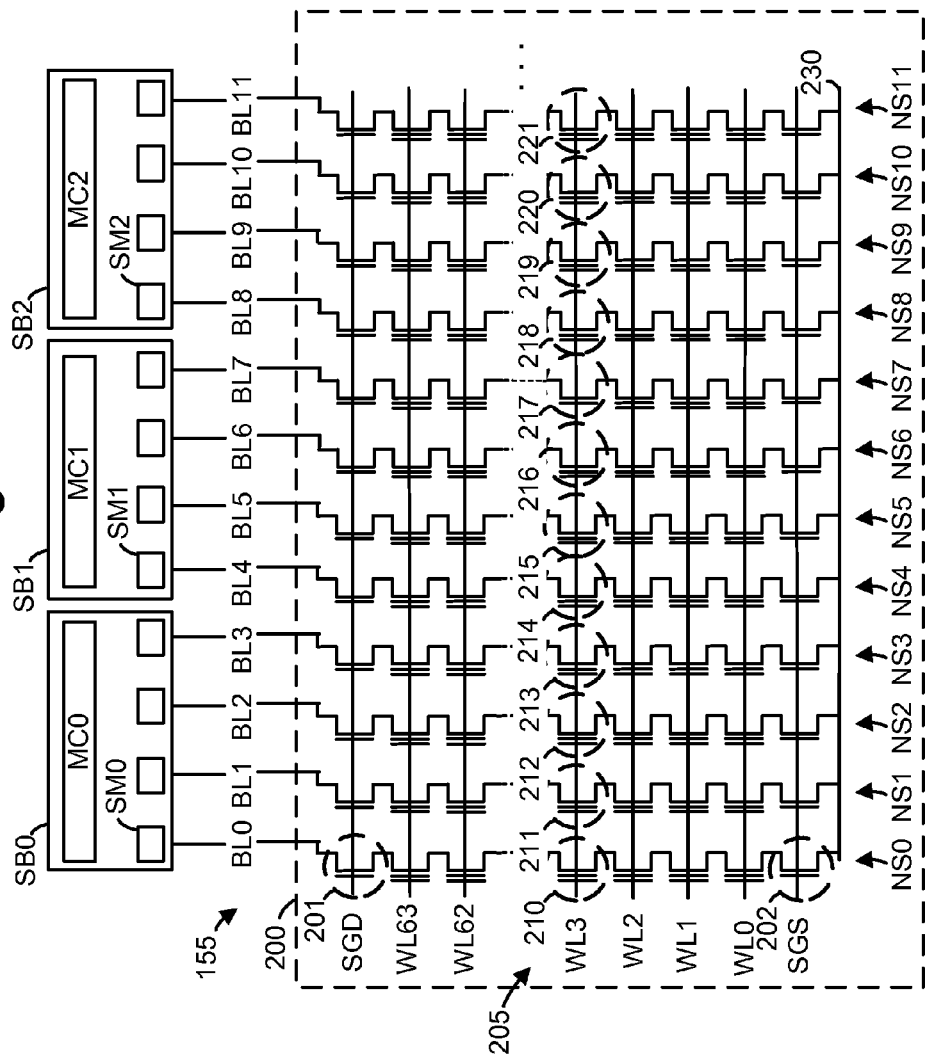
FIG. 2 depicts a block of NAND flash memory cells in the memory array 155 of FIG. 1 and associated sense blocks SB0, SB1 and SB2.

In another embodiment, a non-volatile memory system uses dual row/column decoders and read/write circuits. The various peripheral circuits access opposite sides of the memory array 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half FIG. 2 depicts a block of NAND flash memory cells in the memory array 155 of FIG. 1 and associated sense blocks SB0, SB1 and SB2. The memory array can include many blocks. An example block 200 includes a number of NAND strings NS0 to NS11 and respective bit lines, e.g., BL0 to BL11, which are shared among the blocks. Each NAND string is connected at one end to a drain select gate (SGD), and the control gates of the drain select gates are connected via a common SGD line. Each NAND string is connected at its other end to a source select gate which, in turn, is connected to a common source line 230. For example, NS0 includes a source side select gate transistor 202 and a drain side select gate transistor 201. An example set 205 of memory cells includes memory cells 210-221 which are connected to WL3. For example, WL3 could be a selected word line which is selected for programming and the example memory cells can be selected memory cells which are selected for programming Other memory cells connected to WL3 can also be selected memory cells. Sixty-four word lines, for example, WL0-WL63, extend between the source-side select gates and the drain-side select gates.

In one approach, one sense block is provided for a group of NAND strings, such as four NAND strings. For example, SB0 is associated with BL0-BL3, SB1 is associated with BL4-BL7 and SB2 is associated with BL8-BL11. Each sense block includes a memory controller, e.g., MC0, MC1 and MC2 in SB0, SB1 and SB2, respectively. Each sense block also includes a sense module for each NAND string. Representative sense modules SM0, SM1 and SM2 are depicted in SB0, SB1 and SB2, respectively. SB0 and MC0 are discussed further in connection with FIG. 3.

Other types of non-volatile memory in addition to NAND flash memory can also be used. For example, another type of memory cell useful in flash EEPROM systems utilizes a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the Vth of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor. Another type of memory uses a metallic (conductive) charge memory cell in a NAND architecture.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3:
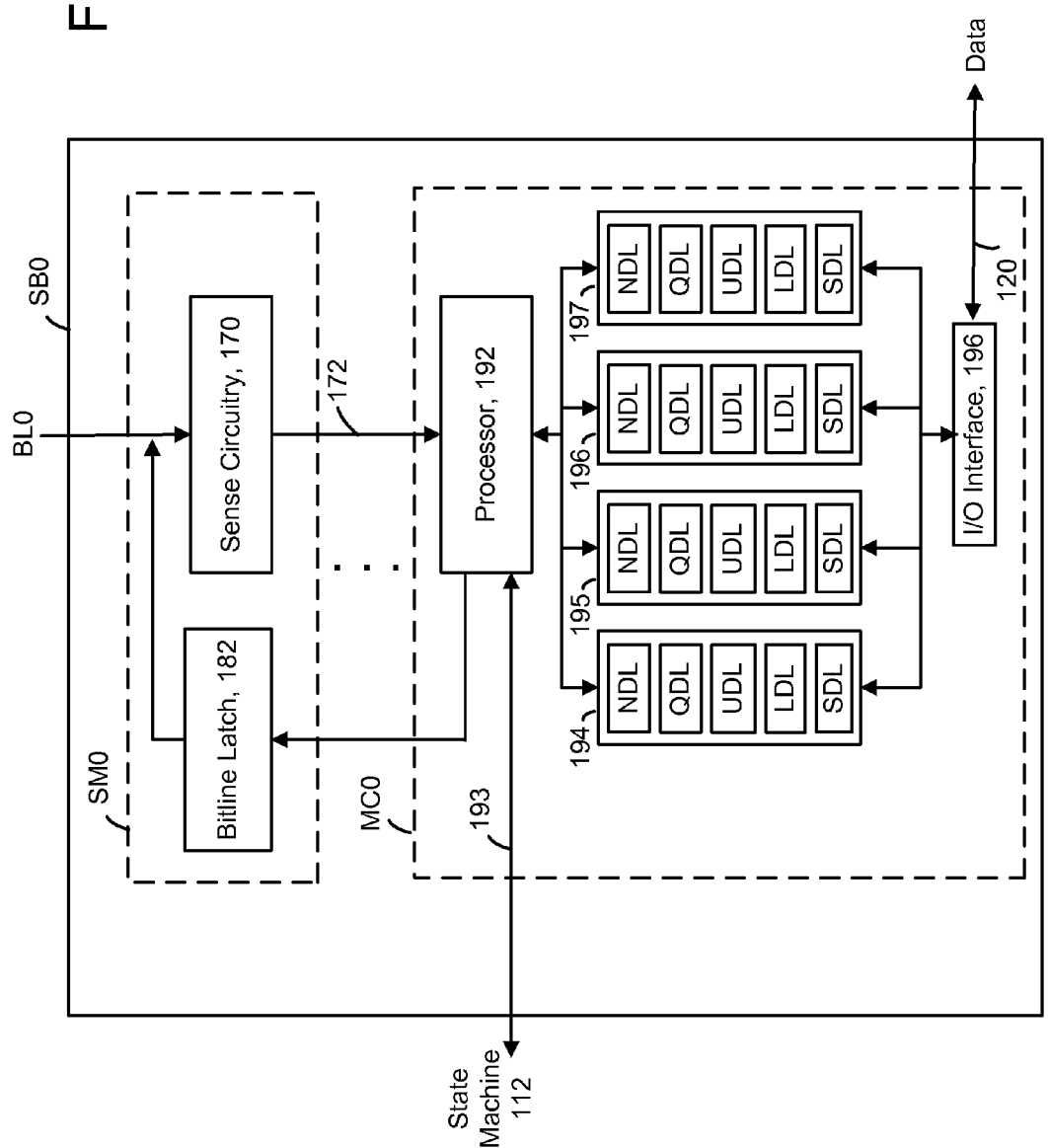
FIG. 3 is a block diagram depicting one embodiment of the sense block SB0 of FIG. 1.

FIG. 3 is a block diagram depicting one embodiment of the sense block SB0 of FIG. 1. The sense block SB0 is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of multiple, e.g., four or eight, sense modules. Each of the sense modules in a group communicates with the associated managing circuit via a data bus 172. Thus, there are one or more managing circuits which communicate with the sense modules of a set of memory cells.

The sense module SM0 comprises sense circuitry 170 that performs sensing by determining whether a conduction current in a connected bit line is above or below a predetermined threshold level. SM0 includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, flag=0 can inhibit programming, while flag=1 allows programming.

Managing circuit MC0 comprises a processor 192, four example sets of data latches 194-197 and an I/O Interface 196 coupled between the set of data latches 194 and data bus 120. One set of data latches can be provide for each sense module, and data latches identified by SDL, LDL, UDL, QDL and NDL may be provided for each set. LDL stores a bit for a lower page (LP) of write data, and UDL stores a bit for an upper page (UP) of write data, in a memory which stores two bits of data in each memory cell. QDL stores a bit indicating whether a quick pass write mode, discussed further below, is active. SDL stores a bit from a read of a memory cell. During a read operation, the SDL latch first receives the bit and optionally can transfer the bit to the other data latches. Moreover, in one approach, LDL is the only data latch the control circuitry can access so that the LP, QPW and UP data are toggled out from the LP latch during a read.

NDL may be dedicated to a noise bit which indicates whether or not a cell is noisy. However, a dedicated latch is not required since unused bit combinations of existing latches can be used to identify noise cells. See, e.g., FIG. 16A-19D.

Additional data latches could be used as well. For example, in a three-bit per memory cell implementation, one extra data latch may be used to store a middle page (MP) of data. A four-bit per memory cell implementation can use lower-middle and upper-middle data latches. Further, more than one QPW latch could be used to designate more than one QPW mode. The techniques provided herein are meant to encompass such variations.

Processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of the state machine 112 that controls the supply of different control gate voltages to the addressed memory cell. As it steps through the various predefined control gate voltages corresponding to the various memory states supported by the memory, the sense module may trip at one of these voltages and a corresponding output will be provided from sense module to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit MC0, bit line latch 182 serves both as a latch for latching the output of the sense module and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each program pulse is followed by a read back (verify) to determine if the memory cell has been programmed to the desired memory state. In some cases, processor 192 monitors the read back memory state relative to the desired memory state. When the two states agree, the processor 192 sets the bit line latch 182 to cause the bit line to be pulled to a state designating program inhibit. This inhibits the memory cell coupled to the bit line from further programming even if program pulses appear on its control gate. In other embodiments, the processor initially loads the bit line latch 182 and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated memory cell has reached certain mileposts in a programming operation. For example, data latches may identify that the Vth of a memory cell is below a particular verify level. The data latches indicate whether a memory cell currently stores one or more bits from a page of data. For example, an LP data latch is flipped (e.g., from 0 to 1) when a lower page bit is stored in an associated memory cell. An UP data latch is flipped when an upper page bit is stored in an associated memory cell. The flipping of a bit occurs when an associated memory cell completes programming, e.g., when its Vth exceeds a target verify level. When lower, middle and upper page bits are used (e.g., in case of three-bit per memory cell memory), the MP data latch is also flipped when a middle page bit is stored in an associated memory cell. Additional information regarding the setting of bit combinations in the data latches is provided, e.g., in connection with FIG. 16A-19D.

FIG. 4A depicts a distribution of read noise for a set of memory cells. The horizontal axis depicts a change in Vth, or dVth, between successive read operations, and the vertical axis depicts, on a log scale, a number of the memory cells associated with the different values of Vth. Most of the cells have a dVth at or near zero, but a substantial number have a dVth of up to, e.g., +/−0.5 V, due to read noise.

Generally, as NAND memory devices are scaled down, noise associated with a single electron has an increasingly larger impact on the Vth of a memory cell. One type of noise is Random Telegraph Noise (RTN), also referred to as read/verify noise. Due to this noise, the Vth of a memory cell can be different when the cell is read at different times. This is believed to be due to electron trapping and de-trapping from trap sites in the tunnel oxide. When an electron traps up, the Vth of the cell increases. On the other hand, when an electron de-traps, the Vth of the cell decreases. RTN events are generally random and occur due to shallow traps (trap sites that need lower energy to be activated) which can be activated by small bias levels that are seen during read operations. Due to RTN, the Vth of a cell during verify may appear to be higher than the verify level due to one or more electrons being trapped up, so that the cell is locked out from further programming. However, during a subsequent read, one or more electrons may be de-trapped so that the Vth appears lower. This can lead to a longer lower tail in the Vth distribution of a set of memory cells and undesirable widening of the Vth distributions, as depicted in FIG. 4B.

FIG. 4B depicts a programmed Vth distribution 400 of a target data state, showing a lower tail 401 of the distribution which is caused by read noise. The horizontal axis represents Vth and the vertical axis depicts a number of cells for different values of Vth. In addition to RTN, the Vth can change between the time a verify test is performed and the time a read is performed due to relaxation, which is a one-time de-trapping of charge. For example, immediately after a program pulse is applied, an electron may be trapped up due to a high Vpgm field. Then, during a verify test, the Vth appears higher and the cell may be locked out from further programming. However, during a subsequent read, the electron is de-trapped, lowering the Vth of the cell and causing a longer lower tail that widens the Vth distributions of the programmed states. Generally, RTN is a random event which can causes the Vth of a cell Vt to increase or decrease in different read operations, while relaxation is mostly a one-direction effect which causes the Vth of a cell to lower as time progresses. However, both of these effects result in lower-tail Vth widening.

If a memory cell's Vth increases after verify, it doesn't affect the upper tail of the Vth distribution much because other mechanisms such as program noise tend to dominate on the upper-tail of the Vth distribution. However, if a memory cell's Vth decreases after verify, it impacts the lower-tail of Vth distribution, resulting in Vth distribution widening. Generally, a cell that is noisy at one time will likely be noisy at another time as well. Thus, by identifying noisy cells at one time, their programming can be adjusted to counteract the effects of the noise.

One approach to identifying a noisy cell is to perform an additional verify test after the cell passes a first verify test. The cells that show different results on the two verify tests are regarded as noisy cells and are then programmed a little higher than other cells to reduce the risk of lower-tail widening. Multiple additional verify tests can be used to determine a degree of noise as well. Various approaches are possible.

FIG. 4C depicts a programming process which identifies, and modifies programming for, noisy cells in a set of memory cells. The process includes identifying noisy memory cells during a programming operation (step 410), and modify subsequent programming of the noisy memory cells (step 412). For example, this can include increasing an amount of programming of the noisy memory cells, compared to an amount of programming for non-noisy memory cells of the same target data state. This can occur, e.g., in the same programming pass, a subsequent programming pass of the same programming operation, or a subsequent programming operation. In another approach, after an erase operation is performed, the modifying of the programming involves manipulating the write data to keep the noisy memory cells in the erased state.

In one approach, noisy cells can be identified and soft programmed in a single programming pass. In another approach, noisy cells can be identified in one programming pass and programmed using a stricter verify level in another programming pass, in one programming operation. This can involve, e.g., a foggy programming pass followed by a fine programming pass. In another approach, noisy cells can be identified in one programming operation and programmed using a stricter verify level in one or more subsequent programming operations, where the cells are erased between programming operations. Generally, data regarding noisy cells can be accumulated over one or more programming passes or operations and used to increase programming of the noisy cells. A storage location in the control or in a memory array can be used to store data which identifies cells as being noisy or non-noisy.

Figure 5A:
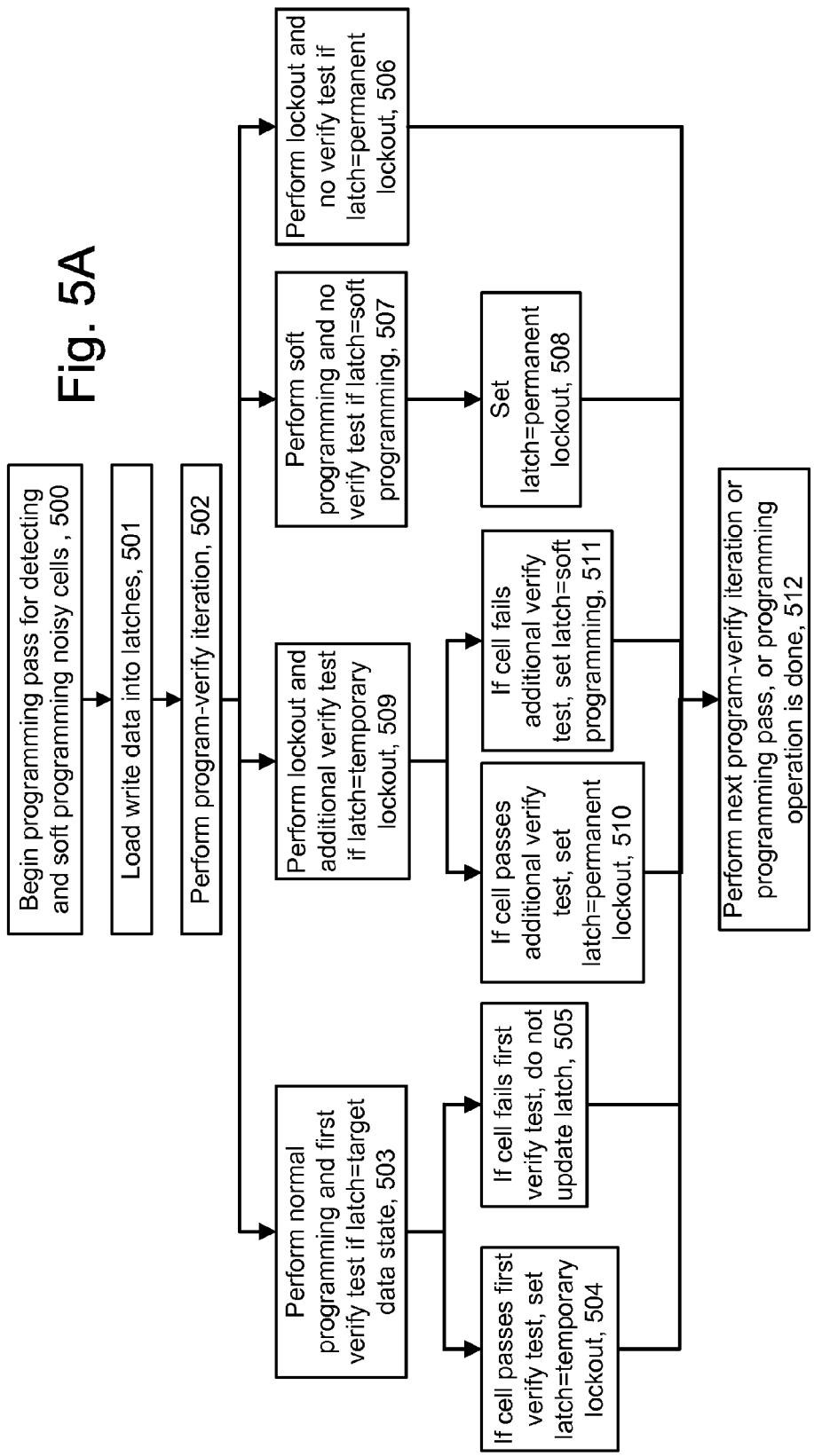
FIG. 5A depicts an example of a single programming pass in which noisy cells are detected and soft programmed

FIG. 5A depicts an example of a single programming pass in which noisy cells are detected and soft programmed Examples include a fine programming pass or one pass write. The latch values can be set to: target data state, temporary lockout, permanent lockout and soft programming.

A memory cell can be in one of various states in a program-verify iteration, according to its latches. When latch=target data state, the cell is to be programmed normally toward its target data state in the current program-verify iteration. When QPW is used, another latch value of latch=QPW indicates that the cell is to be programmed toward its target data state in the QPW mode. When latch=temporary lockout, the cell has passed a first verify test and is not to be programmed in the current program-verify iteration. When latch=soft programming, the cell has failed an additional verify test in a prior program-verify iteration and is to be soft programmed in the current program-verify iteration. When latch=permanent lockout, the cell has passed a first verify test and has either: (a) passed an additional verify test or (b) has failed the additional verify test and been soft programmed. The cell is not to be further programmed in a remainder of the programming pass.

It is possible to define a number of other states as well. For example, states can be set to indicate the results of more than two verify tests, to track one or more program-verify iterations before an additional verify test is performed and after a first verify test is passed, and to track one or more program-verify iterations before soft programmed is performed and after an additional verify test is failed.

Step 500 begins a programming pass for detecting and soft programming noisy cells. Step 501 loads write data into latches. For example, the write data can set the permanent lockout state (e.g., for Er-state cells) or the target data state (e.g., for A-, B- and C-state cells). Step 502 begins a program-verify. In a program portion of the iteration, Vbl is set based on the latches, and a program pulse is applied. In a verify portion, a sensing operation may be performed using a verify level. The sensing of a cell is based on its latches.

Subsequently, one of four branches can be followed for each memory cell. In a first branch, step 503 performs normal programming and a first verify test if latch=target data state. If the cell passes the first verify test (e.g., the cell is in a non-conductive state when sensed at a verify level), we set latch=temporary lockout at step 504. The memory cell will be locked out from programming in one or more subsequent program-verify iterations. At this time, it is not known if the cell is noisy so it is not programmed further until an additional verify test is performed. If the cell fails the first verify test (e.g., the cell is in a conductive state when sensed at a verify level), the latch is not updated (step 505). In a second branch, the cell is locked out from programming and no verify test is performed if latch=permanent lockout, at step 506. The cell remains locked out. In a third branch, the cell is soft programmed and no verify test is performed if latch=soft programming, at step 507. The latch is set to permanent lockout at step 508. In this case, the memory cell has been soft programmed in the current program-verify iteration and no further programming is to be performed in the programming pass.

In a fourth branch, at step 509, the cell is locked out from programming, and an additional verify test is performed if latch=temporary lockout. If the cell passes the additional verify test, the latch is set to permanent lockout at step 510. If the cell fails the additional verify test, the latch is set to soft programming at step 511.

Step 503 can involve different options for different memory cells. One option is setting Vbl to allow normal programming, with an option to use QPW. For example, Vbl=0 V can be used if QPW is not used, or if QPW is used but the cell is not in the QPW mode. Vbl=0.5-1 V can be used if QPW is used and the cell is in the QPW mode.

Further, step 503 can include setting verify pulses for one or more target data states. Typically, the verify pulses have respective levels which are associated with target data states, and are applied to the control gates of the memory cells via a word line. Optionally, an additional verify level which is used solely for identifying noisy cells can be used. The sensing process can be adjusted as well by adjusting the sense time or reference current in a sense amplifier, as discussed further below.

Regarding steps 506 and 509, Vbl=2-3 V can be used to lock out a cell from programming.

Regarding step 507 and soft programming, Vbl can be increased relative to its setting in the most recent program-verify iteration by 0.5-1 V. For example, if Vbl=0 V in the most recent program-verify iteration, Vbl can be set to 0.5-1 V in the current program-verify iteration. If Vbl=0.5 V in the most recent program-verify iteration, such as in the QPW mode, Vbl can be set to 1 V in the current program-verify iteration. To set the appropriate Vbl, the data latches are accessed to determine whether the cell was in the QPW mode when the cell passed the verify test in an nth program-verify iteration. The data latches therefore store data indicating a level of the bit line voltage during the nth program-verify iteration, and the bit line voltage is set during the soft programming based on the data.

Further, Vbl in the slow programming mode can be based on an increase in the Vpgm since the cell passed the verify test. Generally, a program voltage applied to the word line during the soft programming is higher than a program voltage applied to the word line during the nth program-verify iteration. Vbl should therefore be higher during the soft programming than during the nth program-verify iteration.

Further, during soft programming, the bit line voltage can be adjusted based on a target data state of the noisy memory cell. This can be done in the case where a state dependent step size of Vpgm is used. For example, if during higher state programming, a larger Vpgm step size is used, then higher bit line voltage may be used on the higher states.

Step 512 performs a next program-verify iteration, e.g., at step 502, or a next programming pass, or the current programming operation is done.

In one approach, FIG. 5A determines if a cell is noisy based on one additional verify test in one program-verify iteration, after the first verify test is passed, and performs soft programming in one program-verify iteration. However, more generally, the control can determine if a cell is noisy based on one or more additional verify tests, after a first verify test is passed, in one or more program-verify iterations. There can be one or more verify tests in one program-verify iteration, and/or a verify test in each of multiple program-verify iterations, for an individual cell.

Also, the soft programming can be performed in one or more program-verify iterations.

As mentioned, a cell that has a Vth above the first verify level at one time but below the additional verify level (which is the same as or lower than the first verify level) at another time has experienced a decrease in Vth which indicates the cell is noisy. In other words, a cell that has passed a first verify test having a first strictness but has failed an additional verify test having the same strictness or a lower strictness, has experienced a decrease in Vth which indicates the cell is noisy.

Thus, a noisy memory cell is identified as being noisy based on a threshold voltage of the noisy memory cell decreasing over time by any amount or by at least a specified amount, as detected by the one or more additional verify tests and the first verify test. And, a non-noisy memory cell is identified as being non-noisy based on a threshold voltage of the non-noisy memory cell not decreasing over time by any amount or by at least the specified amount, as detected by the one or more additional verify tests and the first verify test. The specified amount can be a difference in Vth which is represented by the first verify level minus the additional verify level, for a data state.

In FIG. 5A and other programming passes, two or more cells will typically be programmed, where one or more cells are identified as noisy cells, and one or more other cells are identified as non-noisy cells. For example, the cells 210-221 of the WL3 in FIG. 2 may be programmed, where cell 210 is a noisy cell and cell 211 is a non-noisy cell. Moreover, assume these two cells have a common target data state such as the C-state. Each cell also have an associated set of data latches. Thus, when the two or more memory cells pass the first verify test in an nth program-verify iteration of the one or more program-verify iterations, where n>=1, one set of data latches 194 is associated with the noisy memory cell 210 and another set of data latches 195 is associated with the non-noisy memory cell 211.

Further, a method includes, during the nth program-verify iteration, providing a bit combination (e.g., C5 in FIG. 16A for Cn mode) in the one set of data latches and in the another set of data latches indicating that the two or more memory cells are to be programmed to a target data state (e.g., C-state). The method includes, during the one or more program-verify iterations in which the two or more memory cells are temporarily locked out from programming and are subject to one or more additional verify tests, providing a bit combination (e.g., C7 in FIG. 16A for Ctl mode) in the one set of data latches and in the another set of data latches indicating that the two or more memory cells are temporarily locked out from programming; and during the one or more program-verify iterations in which the noisy memory cell is further programmed (e.g., soft programmed), providing a bit combination (e.g., C6 in FIG. 16A for Csp mode) in the one set of data latches indicating that the noisy memory cell is to be further programmed, and providing a bit combination (e.g., C0 in FIG. 16A for Cpl mode) in the another set of data latches indicating that the non-noisy memory cell is to be permanently locked out from further programming.

Further, a method includes, in one program-verify iteration of a plurality of program-verify iterations in a programming pass, identifying, among the set of memory cells 205, memory cells having threshold voltages which exceed a verify voltage; in a subsequent program-verify iteration of the plurality of program-verify iterations, determining, without further programming the set of memory cells, one memory cell 211 among the set of memory cells for which the threshold voltage has decreased below the verify voltage and another memory cell 210 among the set of memory cells for which the threshold voltage has not decreased below the verify voltage; in response to the determining, soft programming the one memory cell followed by locking out the one memory cell from programming for a remainder of the programming pass; and in response to the determining, locking out from programming, for the remainder of the programming pass, without further programming, the another memory cell.

FIG. 5B1 depicts an example of a programming pass in which noisy cells are detected but not soft programmed, where the detection occurs before the end of the programming pass. Examples include a foggy programming pass. The latch values can be set to: target data state, temporary lockout and permanent lockout.

Step 520 begins a programming pass in which noisy cells are detected before the end of the programming pass. Step 521 loads write data into the latches. Step 522 performs a program-verify iteration. One of three branches can be followed for each memory cell.

In a first branch, step 523 performs a normal programming and a first verify test if latch=target data state. At step 524, if the cell passes the first verify test, we set latch=temporary lockout. At step 525, if the cell fails the first verify test, the latch is not updated. In a second branch, step 526 performs a lockout and no verify test if latch=permanent lockout. In a third branch, step 527 performs a lockout and an additional verify test. At step 528, if the cell passes the additional verify test, we set latch=permanent lockout. Step 529 stores data identifying the cell as being non-noisy. At step 530, if the cell fails the additional verify test, we set latch=permanent lockout. Step 531 stores data identifying the cell as being noisy.

Step 532 performs a next program-verify iteration, e.g., at step 502, or a next programming pass, or the current programming operation is done.

FIG. 5B2 depicts another example of a programming pass in which noisy cells are detected but not soft programmed, where the detection occurs at the end of the programming pass. Step 550 begins a programming pass in which noisy cells are detected at the end of the programming pass. Step 551 loads write data into the latches. Step 552 performs a program-verify iteration for the target data states. At decision step 553, if programming of all cells is not completed, step 552 is repeated. The cells which pass a verify test are locked out. At decision step 553, if programming of all cells is completed, step 554 is performed. This step performs one or more additional verify tests after a last program-verify iteration of the programming pass, to identify noisy cells and store data identifying the cells as being noisy or non-noisy. For example, see the set of verify voltages 1330 which occur after the last program-verify iteration (e.g., PV13) of the programming pass of FIG. 13A.

For example, the verify test can involve reading all of the cells at a verify level of their target data state, to identify cells for which the Vth has fallen below the verify level of their target data state. These cells are determined to be noisy. For example, the verify test can use the verify levels VvA, VvB or VvC in programming cells from the distribution of FIG. 7A or 7C to the distribution of FIG. 7B. As another example, the verify test could use the verify levels VvA_foggy, VvB_foggy or VvC_foggy in programming cells from the distribution of FIG. 7A to the distribution of FIG. 7C. As another example, the verify test could use verify levels VvA, VvB or VvC in programming cells from the distribution of FIG. 8B to the distribution of FIG. 8C. As another example, the verify test could use the verify levels VvA, . . . , VvG in programming cells from the distribution of FIG. 9C to the distribution of FIG. 9D. The verify test could also use another verify level.

The target data state of a cell can be determined from the original write data. For example, this data may be made available in SLC blocks, in the controller, or in the latches associated with the cells. Step 555 performs a next programming pass for the noisy cells only, or for all cells. For example, additional programming can be performed for the noisy cells only to move their Vth back above a verify level of the target data state. This verify level could be the nominal verify level (e.g., VvA, VvB and VvC in FIG. 7E) which was used in the prior programming pass, in which the noisy cells were detected, or a higher verify level (e.g., VvA_noisy1, VvB_noisy1 and VvC_noisy1 in FIG. 7E). See FIG. 13B. The latter cases represents a stricter verify condition for the noisy cells. Further, it is possible to use a larger program pulse step size in the next programming pass to save programming time. The non-noisy cells can be inhibited in the next programming pass.

Or, the additional programming can be performed without an additional verify test. For example, one or more program pulses can be applied to the noisy cells which are expected to be sufficient to move the Vth above the desired verify level. In a further option, the noisy cells can be programmed at different times in the next programming pass based on their target data state. As an example, a program pulse of magnitude Vpgm_A can be applied to the A-state noisy cells while the B- and C-state noisy cells, and the non-noisy cells are inhibited, then a program pulse of magnitude Vpgm_B can be applied to the B-state noisy cells while the A- and C-state noisy cells, and the non-noisy cells are inhibited, and then a program pulse of magnitude Vpgm_C can be applied to the C-state noisy cells while the A- and B-state noisy cells, and the non-noisy cells are inhibited. Further, Vpgm_A<Vpgm_B<Vpgm_C. See FIG. 13C. Each program pulse provides a desired amount of programming for the noisy cells of each target data state.

FIG. 5B3 depicts an example process for programming noisy cells only. Step 560 begins a programming pass in which noisy cells only are programmed Step 561 determines target data states of the noisy cells. Step 561 performs a program-verify iteration for the target data states. At decision step 563, if programming of all noisy cells is not completed, step 562 is repeated. The cells which pass a verify test are locked out. At decision step 563, if programming of all noisy cells is completed, programming is done at step 565. Alternatively, after step 561, step 564 applies a program pulse to the noisy cells for each target data state, without performing a verify test.

FIG. 5C depicts an example of a programming pass in which noisy cells are programmed using a stricter verify test than non-noisy cells. Examples include a fine programming pass. The latch values can be set to: target data state and permanent lockout.

Step 540 begins a programming pass in which noisy cells are programmed using a stricter verify condition than non-noisy cells. Note that the stricter verify condition may involve having a different sensing current/time or having a different bias applied on the word line or the bit line during sensing, or a combination thereof. Step 542 determines a noisy or non-noisy status of the cells from the latches, as determined from a prior programming pass, in one approach. In a fine programming pass, for example, the data can be maintained from the foggy programming pass, so that the target data state of each cell is known as well as the noisy or non-noisy status. See FIG. 16C. In another approach, the data regarding the noisy or non-noisy status can be accessed from another location such as the control. Optionally, new write data can also be loaded into the latches.

Step 543 performs a program-verify iteration. One of three branches can be followed for each memory cell.

In a first branch, step 544 performs normal programming and an easier verify test if latch=target data state and the cell is non-noisy. In a second branch, step 545 performs normal programming and a stricter verify test if latch=target data state and the cell is noisy. For either of these steps, step 547 or 548 can be performed next. Step 547 sets latch=permanent lockout if the cell passes the verify test. Step 548 does not update the latch if the cell fails the verify test.

In a third branch, step 546 performs a lockout and n verify test if latch=permanent lockout.

Step 549 performs a next program-verify iteration, e.g., at step 543, or a next programming pass, or the current programming operation is done.

FIG. 6A depicts an example of a single programming pass in which an individual noisy cell is detected and/or soft programmed. The steps include: begin programming pass in which noisy cells are detected and/or soft programmed (step 600); perform one or more program-verify iterations until the cell passes a first verify test, at an nth program-verify iteration (step 601); and temporarily lock out the memory cell from being programmed in m subsequent program-verify iterations (step 602). Step 603 sets m as a fixed or variable value. The number m is one or more. An example of m being fixed is setting m to a fixed number such as one. An example of m being variable is to set m as a function of a target data state. When m is greater, the time period between the first verify test and the additional verify test is greater. In some cases, the read noise can vary with this time period as a function of target data state. This approach can therefore optimize the compensation of the read noise.

Further, m can be a function of the number n, e.g., the nth program-verify iteration in a programming pass in which the first verify test is passed. As an example, referring to FIG. 10A, the A-state cells may pass the first verify test at the first through eighth program-verify iteration. We can set m=1 for n<5 and m=2 for n>=5. In this approach, one portion of the A-state cells have m=1 and a remainder of the A-state cells have m=2. An advantage of this approach is that read noise effects with different time constants are compensated. A similar approach can be used for the other states. Consider the case where two or more memory cells are temporarily locked out from programming. In this example, the two or more memory cells pass the first verify test in an nth program-verify iteration of the programming pass, and a number m of program-verify iterations in the one or more program-verify iterations in which the two or more memory cells are temporarily locked out from programming is a function of the number n, where n>=1.

Instead of setting m based on a fixed value of n, m can be set adaptively based on the programming process of the memory cells in a programming pass. For instance, typically a count of memory cells which pass (or fail) a verify test is determined in each program-verify iteration. When this count reaches a certain level, the number of the program-verify iteration can be determined, and m set based on this number. For instance, set m=1 for A-state cells up until 10% of the A-state cells pass the first verify test. Subsequently, set m=2 for the A-state cells. A similar approach can be used for the other states. In this example, a number of program-verify iterations in the one or more program-verify iterations in which two or more memory cells are temporarily locked out from programming is a function of a programming progress of the set of memory cells.

Further, the number m of program-verify iterations in the one or more program-verify iterations in which the two or more memory cells are temporarily locked out from programming can be a function of a target data state of the two or more memory cells. This approach provides a different delay between the first verify test and the additional verify test so that read noise effects with different time constants are compensated. For instance, the lockout can be one program-verify iteration for the A- and B-states and two program-verify iterations for the C-state.

The process further includes: perform one or more additional verify tests on the memory cell while the memory cell is temporarily locked out from programming (step 604). For example, this can be one additional verify test in one program-verify iteration, multiple additional verify tests in one program-verify iteration, or one additional verify test in each of multiple program-verify iterations. The next step is: determine whether the cell is noisy based on a result of the one or more additional verify tests (step 605). For example, if the cell fails the additional verify test, the cell may be identified as being noisy.

Optionally, step 606 is performed to determine the degree of noise based on multiple additional verify tests, and set the amount of soft programming based on the degree of noise. For example, if first and second additional verify tests are performed, possible results include: pass first additional verify test and pass second additional verify test. In this case, the cell is identified as being non-noisy. Another possible result is: pass first additional verify test and fail second additional verify test, or pass second additional verify test and fail first additional verify test. In this case, the cell is moderately noisy.

Another possible result is: fail both first and second additional verify tests. In this case, the cell is highly noisy. Further degrees can be based on the first and second additional verify tests have different levels of strictness, and/or three or more additional verify tests. A larger amount of soft programming can be used when there is a higher degree of noise. The larger amount of soft programming can be achieved, e.g., by a larger or longer Vpgm pulse, or by a smaller Vbl during a program pulse.

Two branches can be followed after step 605. In a first branch, the data regarding whether the cells are noisy is used in the same programming pass. In a second branch, the data regarding whether the cells are noisy is stored for use in a later programming pass or operation.

In the first branch, at step 607, if the cell is noisy, further (soft) programming is performed for the cell, and then the cell is permanently locked out in the programming pass. At step 608, if the cell is not noisy, the cell is permanently locked out in the programming pass and further programming is not performed for the cell.

In the second branch, step 610 stores data indicating whether the cell is noisy for later use.

The programming pass is done at step 609.

Note that a noisy cell can be soft programmed in one or more program-verify iterations. Generally, the memory cell can be soft programmed as soon as the cell is determined to be noisy. The ability to provide soft programming may be reduced if the increase in Vpgm becomes too high between the nth program-verify iteration and the program-verify iteration in which soft programming is provided, since the ability to increase Vbl is limited. In one approach, Vpgm increases with each program-verify iteration. The increase in Vbl can be based on the increase in Vpgm between the nth program-verify iteration and the program-verify iteration in which the soft programming is provided.

As an example, consider an A-state cell where n=5. In this case, the first verify test is passed in the fifth program-verify iteration, the cell is subject to the additional verify test in the sixth program-verify iteration, and the cell is soft programmed in the seventh program-verify iteration.

FIG. 6B depicts an example of a programming pass in which an individual noisy cell is programmed. The steps include: begin programming pass in which a noisy cell is programmed (step 620); and access data indicating whether a cell is noisy (step 621). Subsequently, one of two branches can be followed. In a first branch, the cell is programmed and subject to a stricter verify test if the cell is noisy. In a second branch, the noisy cell is kept in the erased state. See, e.g., FIG. 20A-20C. Specifically, step 622 performs one or more program-verify iterations until a cell passes a verify test, where the verify test is stricter for a noisy cell than for a non-noisy cell. Step 624 keeps a noisy cell in an erased state, and stores data identifying the target data state.

FIG. 6C depicts threshold voltage (Vth) distributions and verify levels for programming using binary data. The graph depicts Vth on the horizontal axis and a number or population of memory cells in a Vth distribution on the vertical axis. The techniques described herein are applicable to both binary (one bit per cell) and multi-level (two or more bits per cell) memory devices. Vth distributions 660 and 661 represent a 1-state and a 0-state, respectively. VvSLCL is a QPW verify level, VvSLC is the normal target verify level, and VvSLC_noisy is a verify level for a noisy cell.

FIGS. 7A and 7B depict Vth distributions in a single pass programming operation which uses four data states. FIG. 7A depicts an erased (Er) state Vth distribution 700, and FIG. 7B depicts Vth distributions 700, 704, 706 and 708 after programming following the Vth distribution of FIG. 7A.

One pass programming, also referred to as "one-pass write" programming, involves a sequence of multiple program-verify operations which are performed starting from an initial program voltage (Vpgm) and proceeding to a final Vpgm until the threshold voltages of a set of selected memory cells reach one or more respective verify levels of respective target data states. In one pass programming, all memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 700 is provided for erased (Er) state memory cells. Three Vth distributions 704, 706 and 708 represent target data states A, B and C, respectively, which are reached by memory cells when their Vth exceeds a final verify level VvA, VvB or VvC, respectively, of the target data state.

A program option which uses a slow programming mode can be referred to as a "quick pass write" (QPW) technique. QPW can be used independently in one or more passes of a multiple pass programming technique. Although, generally, it is sufficient to use QPW in the final programming pass when accuracy is most important.

When QPW is used, lower, QPW verify levels (VvAL, VvBL or VvCL) are defined such that the memory cells enter a slow programming mode (e.g., by raising the associated bit line voltages applied during a program pulse to a level such as 0.5-1 V) when their Vth is between the QPW verify level and the final verify level of a respective target data state. The QPW verify levels are offset below the respective final verify levels, in one implementation. Subsequently, when a verify test determines that the Vth of a memory cell exceeds the final verify level, the memory cell is inhibited from further programming (e.g., by raising the associated bit line voltages applied during a program pulse to a level such as 2-3 V).

In some cases, QPW is used on fewer than all target data states. For example, a wider Vth distribution may be acceptable for the highest data state (e.g., the C-state) so that the QPW can be used for states other than the C-state, such as the A or B-state. Total programming time may be reduced by avoiding the use of QPW with the highest data state, since the time spent in sensing whether the Vth exceeds VvCL can be avoided.

Read reference voltages VrA, VrB and VrC which are between the Vth distributions are used for reading data from the memory cells. By testing whether the Vth of a given memory cell is above or below one or more of the read reference voltages, the system can determine the data state which is represented by a memory cell.

FIG. 7C depicts Vth distributions after programming using foggy verify levels following the Vth distribution of FIG. 7A, as an alternative to FIG. 7B. One type of multi-pass programming is referred to as foggy-fine programming. The term "foggy" indicates that the cells are programmed to a relatively wide Vth distribution, and the term "fine" indicates that the cells are programmed to a relatively narrow Vth distribution. In one implementation, the A-state, B-state and C-state memory cells are programmed from the E-state distribution 700 to the distributions 710, 712 and 714, respectively, using foggy verify levels VvA_foggy, VvB_foggy and VvC_foggy, respectively. This is the foggy programming pass, which is typically the next-to-last pass of a multi-pass programming operation. In a two-pass programming operation, the foggy programming pass can be the first pass and a fine programming pass (see FIG. 7D) can be the second pass.

A relatively large program pulse step size may be used, for instance, to quickly program the memory cells to the respective verify levels. Wider Vth distributions may be achieved compared to the case of FIG. 7B. If QPW is not used in the fine programming pass, the foggy verify levels could be the same as, or different than, the lower, QPW verify levels. If QPW is used in the fine programming pass, the foggy verify levels should be lower than the QPW verify levels so that QPW technique can be effective in the fine programming pass.

FIG. 7D depicts Vth distributions after programming using fine verify levels for noisy and non-noisy cells following the Vth distribution of FIG. 7C. The fine verify levels are used in the fine programming pass, which is typically the last pass of a multi-pass programming operation. In one possible implementation, noisy and non-noisy memory cells are distinguished in the foggy programming pass, and the noisy cells are programmed to a higher Vth than the non-noisy cells in the fine programming pass using the verify levels of VvA_noisy, VvB_noisy and VvC_noisy for the A-, B- and C-states, respectively. The same final overall Vth distributions 704, 706 and 708 as in FIG. 7B are depicted. The sub-distributions 705, 707 and 709 represent a portion of each overall distribution which is made up of the noisy cells. Generally, a small portion of the cells will be noisy. The non-noisy cells are programmed using the normal, final verify levels VvA, VvB and VvC (non-noisy verify levels). A relatively small program pulse step size may be used in the fine programming pass to slowly program the memory cells to the verify levels while avoiding a large overshoot.

In this example, the noisy verify level is higher than the non-noisy verify level by a fixed amount for each target data state.

FIG. 7E depicts an alternative to FIG. 7D in which the verify strictness is a function of target data state. In this example, the noisy verify level is higher than the non-noisy verify level by an amount which is a function of target data state. For instance, the difference between the two verify levels is higher when the target state is higher. This provides a stricter verify test for the noisy memory cells than the non-noisy memory cells when the target state is higher. Larger decreases in Vth due to read noise may occur for higher target data states. This approach counteracts the Vth decreases as a function of target data state. The same final overall Vth distributions 704, 706 and 708 as in FIG. 7B are depicted. The sub-distributions 720, 721 and 722 represent a portion of each overall distribution which is made up of the noisy cells.

While this example involves foggy-fine programming, it can apply to any type of programming pass in a programming operation. This is an example of identifying noisy and non-noisy cells in one programming pass, storing data based on the identifying and, during a subsequent programming pass, performing one or more program-verify iterations comprising a verify test using a higher degree of strictness for the noisy memory cells than for the non-noisy memory cells. In one case, the one programming pass is a foggy programming pass and the subsequent programming pass is a fine programming pass.

As mentioned, the degree of strictness of the verify test for the noisy memory cells can be a function of the target data state. For instance, according to the higher degree of strictness, a verify voltage for the noisy memory cell (e.g., VvA_noisy, VvB_noisy, VvC_noisy; VvA_noisy1, VvB_noisy1, VvC_noisy1) can be higher than a verify voltage for the non-noisy memory cell (e.g., VvA, VvB, VvC), for one or more of the target data states.

Further, an amount by which the verify voltage for the noisy memory cell is higher than the verify voltage for the non-noisy memory cell, can be relatively high when the target data state is relatively high (e.g., (VvC_noisy1−VvC)>(VvB_noisy1−VvB)>(VvA_noisy1−VvA)), for one or more of the target data states.

According to the higher degree of strictness, a sense time for the noisy memory cell can be longer than a sense time for the non-noisy memory cell. Also, a reference current for the noisy memory cell can be higher than a reference current for the non-noisy memory cell.

FIG. 8A to 8C depict a two-pass programming operation with four data states, where the Vth distributions of FIGS. 8B and 8C are reached based on lower and upper pages of data, respectively. Initially, all memory cells are in the Er state, represented by the distribution 800. FIG. 8B depicts programming of a lower page of data. If the lower page has a bit=1, the associated memory cell remains in the distribution 800 and the data is represented by x1, where x is an upper page bit that is not yet known. If the lower page has a bit=0, the memory cell is programmed to a higher Vth as represented by distribution 802, which is an interim distribution (INT), using a verify level VvINT. The data of these memory cells is represented by x0. Note that the interim distribution can be relatively wide since it is not a final distribution and does not represent a final data state.

FIG. 8C depicts programming of an upper page of data. If UP/LP=11, the associated memory cell in the Er state remains in the Er state and stores data bits 11. If UP/LP=01, the memory cells in the Er state are programmed to the A-state distribution 804 (A-state). If UP/LP=10, the memory cells in the INT distribution are programmed to the C-state distribution 808. If UP/LP=00, the memory cells in the INT distribution are programmed to the B-state distribution 806.

The QPW verify levels are VvAL, VvBL and VvCL, so that the QPW mode can optionally be used when the Vth is between VvAL and VvA, VvBL and VvB, or VvCL and VvC for memory cells for which the target state is A, B or C, respectively.

Programming can be similarly extended to three or more bits per memory cell.

Figure 9A:
FIG. 9A to 9D depict a three-pass programming operation with eight data states, where
Figure 9B:
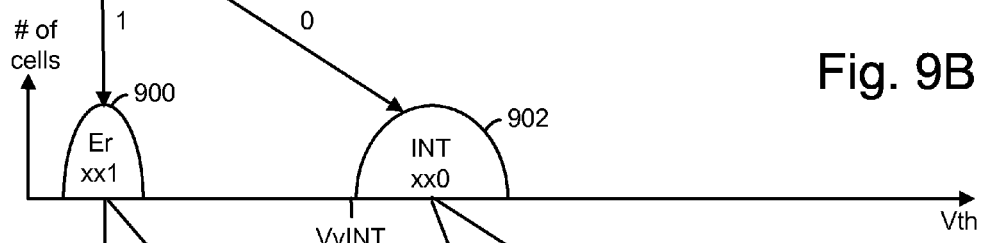
Figure 9C:
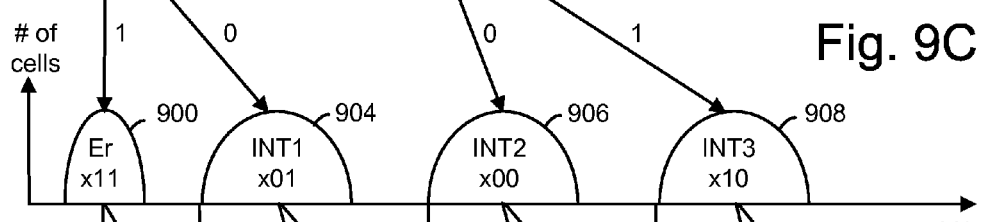
Figure 9D:
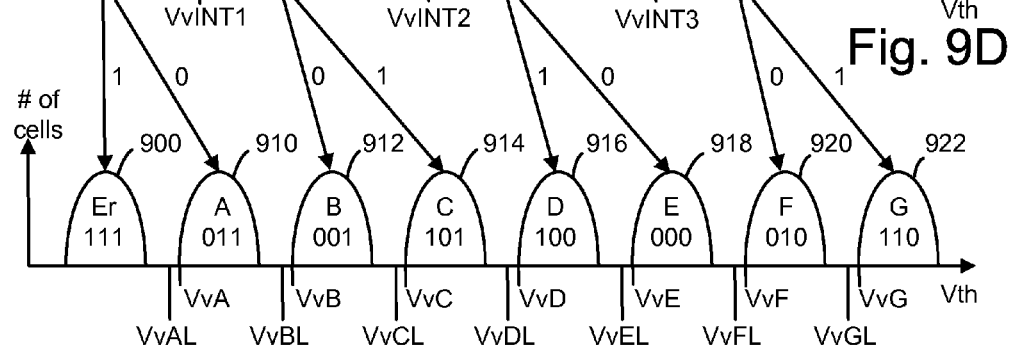

For example, FIG. 9A to 9D depict a three-pass programming operation with eight data states, where the Vth distributions of FIGS. 9B, 9C and 9D are reached based on lower, middle and upper pages of data, respectively. Programming of lower, middle and upper pages in three-bit, eight-level memory cells is depicted. Seven programmed data states, A through G, are used in addition to the Er state, for eight states total. Initially, all memory cells are in the Er state, represented by the distribution 900. The lower page is programmed to the Vth distributions of FIG. 9B. If LP=1, memory cells in the Er state remain in that state. If LP=0, memory cells are programmed to the INT distribution 902 using VvINT. The middle page is programmed in FIG. 9C. If MP=1, memory cells in the Er state remain in that state, and memory cells in the INT state are programmed to an interim distribution 908 using a verify level VvINT3. If MP=0, memory cells in the Er state are programmed to an interim distribution 904 using a verify level VvINT1, and memory cells in the INT distribution are programmed to an interim distribution 906 using a verify level VvINT2.

The upper page is programmed in FIG. 9D. QPW can optionally be used for this pass. If UP=1, memory cells in the Er state remain in that state. Also, memory cells in distributions 904, 906 and 908 are programmed to the C-state distribution 914, D-state distribution 916 and G-state distribution 922, respectively. If UP=0, memory cells in the Er state are programmed to the A-state distribution 910. Also, memory cells in the distribution 904, 906 and 908 are programmed to the B-state distribution 912, E-state distribution 918 and F-state distribution 920.

The QPW verify levels are VvAL, VvBL, VvCL, VvDL, VvEL, VvFL and VvGL so that the QPW mode can optionally be used is used when the Vth is between VvAL and VvA, VvBL and VvB, VvCL and VvC, VvDL and VvD, VvEL and VvE, VvFL and VvF, and VvGL and VvG, for memory cells for which the target state is A, B, C, D, E, F or G, respectively.

Programming using four bits per cell (16 levels) can similarly involve four pages. Additionally, when programming multiple pages of data, a back and forth word line order may be used to reduce potential disturbs from capacitive coupling.

FIG. 9E depicts Vth distributions after programming using foggy verify levels following the Vth distribution of FIG. 9C, as an alternative to FIG. 9D. Similar to FIG. 7C, foggy verify levels VvA_foggy, VvB_foggy, VvC_foggy, VvD_foggy, VvE_foggy, VvF_foggy and VvG_foggy can be used for programming memory cells to foggy Vth distributions 930, 932, 934, 936, 938, 940 and 942, respectively, of the A-, B-, C-, D-, E-, F- and G-states, respectively. See also FIG. 13A.

FIG. 9F depicts Vth distributions after programming using fine verify levels for noisy and non-noisy cells following the Vth distribution of FIG. 9E. Similar to FIG. 7D, noisy and non-noisy memory cells are distinguished in the foggy programming pass, and the noisy cells are programmed to a higher Vth than the non-noisy cells in the fine programming pass using verify levels of VvA_noisy, VvB_noisy, VvC_noisy, VvD_noisy, VvE_noisy, VvF_noisy and VvG_noisy for the A-, B-, C-, D-, E-, F- and F-states, respectively. The same final overall Vth distributions 910, 912, 914, 916, 918, 920 and 922 as in FIG. 9D are depicted. The sub-distributions 911, 913, 915, 917, 919, 921 and 923 represent a portion of each overall distribution which is made up of the noisy cells. The non-noisy cells are programmed using the normal, final verify levels VvA, VvB, VvC, VvD, VvE, VvF and VvG. By programming the noisy cells to a higher Vth, a subsequent decrease in Vth due to read noise is compensated. This approach involves a time penalty due to the use of the noisy verify levels. See also FIG. 14.

The difference between the verify levels for noisy cells and non-noisy cells can be fixed or a function of target data state, as discussed.

In the example programming techniques discussed, the Vth of a memory cell is raised gradually as it is programmed to a target data state. However, programming techniques can be used in which the Vth of a memory cell is lowered gradually as it is programmed to a target data state. Programming techniques which measure memory cell current can be used as well. The concepts herein can be adapted to different programming techniques.

FIG. 10A depicts program-verify iterations in an example of a single programming pass in which four data states are used, consistent with FIGS. 7A and 7B. In this example, QPW is not used.

The horizontal axis depicts a program-verify iteration number (PV) and the vertical axis depicts control gate or word line voltage. Generally, a programming operation can involve applying a pulse train to a selected word line, where the pulse train includes multiple program-verify iterations. The program portion of the program-verify iteration comprises a program pulse, and the verify portion of the program-verify iteration comprises one or more verify pulses.

A pulse train typically includes program pulses which increase stepwise in amplitude in each program-verify iteration using a fixed or varying step size. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

The pulse train 1000 includes a series of program pulses 1001-1015 that are applied to a word line selected for programming, and to control gates of an associated set of non-volatile memory cells. One, two or three verify pulses are provided after each program pulse as an example, based on the target data states which are being verified. 0 V may be applied to the selected word line between the program and verify pulses. For example, one or more of an example A-state verify pulse 1020 (VvA), B-state verify pulse 1021 (VvB) and C-state verify pulse 1022 (VvC) may be applied in different program-verify iterations. In this approach, the verify pulses are set based on the programming progress in which A-state cells complete programming before B-state cells, and B-state cells complete programming before C-state cells. Programming time is minimized by this approach.

Further, a verify test is performed using each verify pulse to determine whether a cell has a Vth above or below the verify level. In a verify test, a sensing operation is performed for cells along a word line. A current in each NAND string is compared to a reference current at a sense time. If the current exceeds a reference current, the cell in the NAND string is considered to be in a conductive state and the Vth is below the verify level (the verify test is failed). If the current is less than the reference current, the cell in the NAND string is considered to be in a non-conductive state and the Vth is above the verify level (the verify test is passed).

When a cell is sensed and subject to a verify test, data latches can be updated based on a result of the verify test. Further, sensing data regarding the cell (a pass/fail result of each verify test) can be provided to a controller for use in determining that a noisy memory cell is noisy and that a non-noisy memory cell is not noisy.

As an example, for a target data state, the same verify level can be used for the first verify test and the additional verify test. For example, an A-state cell can be verified using VvA in both the first verify test and the additional verify test.

In this example, the noisy cells can be identified and/or subject to soft programming in a programming pass without modifying the verify or programming voltages which are normally used. As a result, there is no time penalty.

Note that noise detection may not occur for all programmed cells. For example, for the C-state cells that pass the verify test at PV15, after program pulse 1015, there is no additional verify test. These cells can be treated as non-noisy as a default. Or, it is possible to provide the additional verify test without a further program pulse, e.g., as PV16. This would result in a time penalty but would allow all cells to be noise-checked.

FIG. 10B depicts program-verify iterations in an alternative to FIG. 10A, where quick pass write (QPW) verify levels are used, consistent with FIGS. 7A and 7B. This example differs from FIG. 10A in that QPW is used.

The horizontal axis depicts a program-verify iteration number (PV) and the vertical axis depicts control gate or word line voltage. The pulse train 1050 includes a series of program pulses 1051-1065 that are applied to a word line selected for programming, and to control gates of an associated set of non-volatile memory cells. Two, four or six verify pulses are provided after each program pulse as an example, based on the target data states which are being verified. Example verify pulses include an A-state QPW verify pulse 1070 (VvAL), an A-state normal verify pulse 1071 (VvA), a B-state QPW verify pulse 1072 (VvBL), a B-state normal verify pulse 1073 (VvB), a C-state QPW verify pulse 1074 (VvCL) and a C-state normal verify pulse 1075 (VvC).

In this example, the noisy cells can be identified and/or subject to soft programming in a programming pass without modifying the verify or programming voltages. As a result, there is no time penalty.

In one approach, for a target data state, the same verify level is used for the first verify test and the additional verify test. For example, the A-state cell can be verified using VvA in both the first verify test and the additional verify test. Or, the A-state cell can be verified using VvAL in both the first verify test and the additional verify test.

However, it is possible for first verify test and the additional verify test to differ in strictness. For example, the additional verify test can be less strict than the first verify test. For example, an A-state cell can be verified using VvA in in the first verify test and using VvAL (a lower control gate voltage) in the additional verify test. A B-state cell can be verified using VvB in in the first verify test and using VvBL (a lower control gate voltage) in the additional verify test. A cell that passes the first verify test and fails the less strict additional verify test can be considered to be noisy with a high amount of certainty, since there has been a significant decrease in Vth. It is also possible, e.g., that for a B-state cell, VvBL is the more strict verify voltage used in the first verify test and VvA is the less strict verify voltage used in the additional verify test. In this case, the additional verify test is associated with a lower data state. The strictness of a verify test can be varied in other ways than by varying the control gate voltage as mentioned.

FIG. 11A depicts program-verify iterations in an example of a single programming pass in which two data states are used, consistent with FIG. 6C. The pulse train 1100 includes a series of program pulses 1101-1106. One verify pulse is provided after each program pulse as an example, based on the target data state which is being verified. Example verify pulses include an SLC-state verify pulse 1110 (VvSLC).

FIG. 11B depicts program-verify iterations in an alternative to FIG. 11A, where the QPW verify levels of FIG. 6C are used. The pulse train 1150 includes a series of program pulses 1151-1156. Two verify pulses are provided after each program pulse as an example. Example verify pulses include a QPW verify pulse 1160 (VvSLCL) and a normal verify pulse 1161 (VvSLC).

FIG. 12 depicts program-verify iterations in an example of a programming pass for a lower page of data, consistent with FIG. 8B. The pulse train 1200 includes a series of program pulses 1201-1206. Example verify pulses include an INT-state verify pulse 1210 (VvINT).

FIG. 13A depicts program-verify iterations in an example of a foggy programming pass, consistent with FIG. 7C. QPW mode is not used. The horizontal axis depicts a program-verify iteration number (PV) and the vertical axis depicts control gate or word line voltage. The pulse train 1300 includes a series of program pulses 1301-1313 that are applied to a word line selected for programming, and to control gates of an associated set of non-volatile memory cells. One, two or three verify pulses are provided after each program pulse as an example, based on the target data states which are being verified. For example, one or more of an example A-state foggy verify pulse 1320 (VvA_foggy), B-state foggy verify pulse 1321 (VvB_foggy) and C-state foggy verify pulse 1322 (VvC_foggy) may be applied in different program-verify iterations.

As mentioned, noisy cells can be identified through a first verify test and an additional verify test for each target data state. For example, an A-state cell can be verified using VvA_foggy in both the first verify test and the additional verify test. A B-state cell can be verified using VvB_foggy in both the first verify test and the additional verify test. Another example is that a B-state cell is verified using VvB_foggy in the first verify test and VvA_foggy in the additional verify test.

In this example, the noisy cells can be identified and/or subject to soft programming in a programming pass without modifying the verify or programming voltages. As a result, there is no time penalty.

A set of verify voltages 1330 may optionally be used to provide an additional verify test which occurs after a last program-verify iteration (e.g., PV13) of the programming pass, as discussed in connection with step 554 of FIG. 5B2.

FIG. 13B depicts program-verify iterations in an example of additional programming for noisy cells only. The pulse train 1340 includes a series of program pulses 1341-1345 that are applied to a word line selected for programming. An example set of verify voltages 1346 provide a stricter verify test for the noisy cells.

Figure 14:
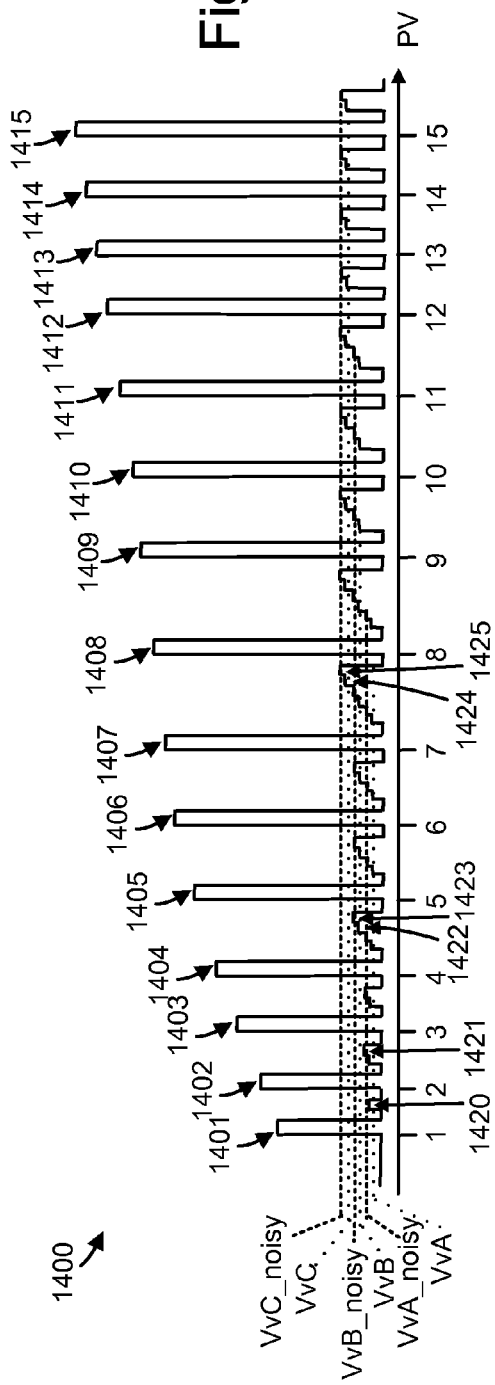
FIG. 14 depicts program-verify iterations in an example of a programming pass, consistent with FIGS. 7E and 9F.

FIG. 13C depicts program pulses in an example of additional programming for noisy cells only. The pulse train 1350 includes a series of program pulses 1351, 1352 and 1353 with amplitudes Vpgm_A, Vpgm_B and Vpgm_A, respectively, that are applied to a word line selected for programming. No verify test is performed, in one example. FIG. 14 depicts program-verify iterations in an example of a programming pass, consistent with FIGS. 7E and 9F. This example uses verify pulses which are dedicated for noise detection and therefore result in a time penalty. However, the ability to use a verify pulse which is optimized for noise detection for each target data state can be valuable. In comparison, verify pulses for normal programming are optimized to provide a narrow Vth distribution.

The pulse train 1400 includes a series of program pulses 1401-1415. One, two, four or six verify pulses are provided after each program pulse as an example, based on the target data states which are being verified. Example verify pulses include an A-state non-noisy (normal) verify pulse 1420 (VvA), an A-state noisy verify pulse 1421 (VvA_noisy), a B-state non-noisy verify pulse 1422 (VvB), a B-state noisy verify pulse 1423 (VvB_noisy), a C-state non-noisy verify pulse 1424 (VvC) and a C-state noisy verify pulse 1425 (VvC_noisy).

Figure 15A:
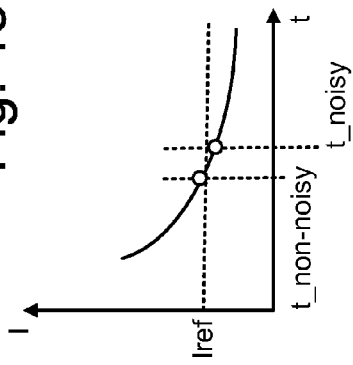
FIG. 15A depicts a current versus time relationship during a sensing operation, where different reference currents are used for noisy and non-noisy memory cells.

FIG. 15A depicts a current versus time relationship during a sensing operation, where different reference currents are used for noisy and non-noisy memory cells. The horizontal axis depicts a sense time (t_sense) and the vertical axis depicts a sense current. A strictness of a verify test can be increased by using a lower reference current. During a sensing operation, a verify pulse is applied to the control gate of a selected memory cell in a NAND string. The remaining memory cells are unselected and have a relatively large pass voltage applied to their control gate to provide them in a strongly conductive state, so that a current of the NAND string relies only on the conductive state of the selected memory cell. A voltage can be applied to the NAND string via a bit line, and a decay characteristic of a resulting current in the sense amplifier sense-node can be measured and compared to a reference current at a sense time. If the measured current is greater than the reference current, the selected memory cell is in a conductive state and fails the verify test. If the measured current is less than the reference current, the selected memory cell is in a non-conductive state and passes the verify test. If a lower reference current is used, it means the cell will have to program to a higher Vth before it reaches that lower reference current. Similarly, a longer sense time is a stricter than a shorter sense time.

In this example, a stricter verify test is provided using a lower reference current of Iref_noisy. An easier verify test is provided using a higher reference current of Iref_non-noisy. The same cell needs to reach a higher Vth level for it to pass the verify test when the reference current is lower.

Generally, a sense parameter for a noisy memory cell can be different during a verify test of the one or more additional verify tests, than during the first verify test. The sense parameter which is different comprises at least one of a sense time used by a sense circuit, a reference current used by the sense circuit and a verify voltage applied to the word line. The sense parameter can be stricter during the verify test of the one or more additional verify tests, than during the first verify test.

Figure 15B:
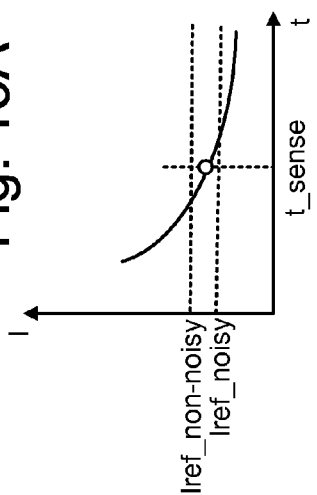
FIG. 15B depicts a current versus time relationship during a sensing operation, where different sensing times are used for noisy and non-noisy memory cells.

FIG. 15B depicts a current versus time relationship during a sensing operation, where different sensing times are used for noisy and non-noisy memory cells. A strictness of a verify test can be increased by using a longer sensing time. In this example, a stricter verify test is provided using a longer sensing time of t_noisy. An easier verify test is provided using a shorter sensing time of t_non-noisy.

Adjusting the strictness of the verify test using reference current or sense time can be useful because it allows different levels of strictness in one program-verify iteration without using a different verify voltage on the word line. For example, a single verify voltage can be applied to a word line while two or more sensing operations are performed, one after another, by changing the reference current and/or sense time.

FIG. 16A depicts an example arrangement of bit combinations in data latches, where there are four data states, and two previously unused bit combinations C6 and C7 are used to identify a soft programming mode (Csp) and a temporary lockout mode (Ctl), respectively, for a C-state memory cell.

Eight example unique bit combinations are denoted by C0-C7. This notation is also used in the following figures.

Generally, a bit combination is a sequence or string of two or more bits. The number of different bit combinations which can be stored in x latches is 2^x. The latch names are consistent with FIG. 3. LDL is the lower page latch, UDL is the upper page latch and QPW is the QPW mode latch. Further, Er is the erased state, the other data states are A, B or C, as an example of a four-state memory device. The examples can be extended to more than four states. "n" denotes the mode for normal programming speed (non-QPW mode), "q" denotes the QPW programming mode, "pl" denotes permanent lockout, "sp" denotes soft programming and "tl" denotes temporary lockout.

C0 is used to identify the Er state cells and the permanently locked out A-, B- and C-state cells (Apl, Bpl and Cpl, respectively). C1 identifies the An mode. C2 identifies the Aq mode. C3 identifies the An mode. C4 identifies the Bq mode. C5 identifies the Cn mode.

Conventionally, two bit combinations are unused (e.g., C6 and C7). In this example, C6 is used to identify a C-state cell which is in a soft programming mode and C7 is used to identify a C-state cell which is in a temporary lockout mode. An advantage is that a noise detection and soft programming capability can be provided for cells of one target data state without providing additional latches. This approach is useful since noise compensation is provided for some, if not all, cells. One additional latch would provide a sufficient number of bit combinations to provide a noise detection and soft programming capability for the remaining states. The A-state can have bit combinations for Asp and Atl, and the B-state can have bit combinations for Bsp and Btl.

FIG. 16B depicts an example arrangement of bit combinations in data latches, where the bit combinations C2 and C4 of FIG. 16A are used to identify a soft programming mode (Bsp) and a temporary lockout mode (Btl), respectively, for a B-state memory cell. By omitting the use of QPW, the bit combinations data C2 and C4 can be used to provide a noise detection and soft programming capability for an additional data state such as the B-state.

FIG. 16C depicts an example arrangement of bit combinations in data latches, where the bit combinations C2, C4, C6 and C7 of FIG. 16A are used to identify a B-state noisy cell, a B-state non-noisy cell, a C-state noisy cell and a C-state non-noisy cell, respectively.

Previous examples indicated that the noise detection can occur in one programming pass (e.g., a foggy pass) while the adjustment of the programming for the noisy cells occurs in a subsequent programming pass (e.g., a fine pass), such as in FIGS. 5B1 and 6B. In this case, different bit combinations at the end of the one programming pass distinguish noisy cells from non-noisy cells, for one or more target data states. In this example, the QPW mode is omitted. At the end of a first programming pass: Apl1 identifies an A-state cell, Bpl1_noisy identifies a noisy B-state cell, Bpl1_non_noisy identifies a non-noisy B-state cell, Cpl1_noisy identifies a noisy C-state cell, and Cpl1_non_noisy identifies a non-noisy C-state cell. At the beginning of a second programming pass, the A-state cells can be programmed without regard to whether the cells are noisy, while the noisy B-state and noisy C-state cells are subject to a stricter verify test than the non-noisy B-state and non-noisy C-state cells, respectively. C0 can be used to identify the A-, B- and C-state cells which are permanently locked out in the second programming pass, as represented by Apl2, Bpl2 and Cpl2, respectively.

FIG. 17A-17E depict bit combinations in data latches during a programming operation involving four data states, up to completion of the B-state programming FIG. 17A depicts bit combinations at the start of a programming pass, where the combinations indicate that the cells are to remain in the Er state or are to be programmed to the A, B or C-state. The bit combinations are consistent with FIG. 16A. This represents write data which is loaded into the data latches. QPW mode is used.

FIG. 17B depicts the bit combinations of FIG. 17A after the A-state cells pass the VvAL verify level. The QDL for the A-state bit is flipped to 1. A flipped bit is underlined in these figures.

FIG. 17C depicts the bit combinations of FIG. 17B after the A-state cells pass the VvA verify level. The UDL bit for the A-state is flipped to 1.

FIG. 17D depicts the bit combinations of FIG. 17C after the B-state cells pass the VvBL verify level. The QDL bit for the B-state is flipped to 1.

FIG. 17E depicts the bit combinations of FIG. 17D after the B-state cells pass the VvB verify level. The LDL and UDL bits for the B-state are flipped to 1.

FIG. 17F depicts one option for the bit combinations in the data latches after completion of the C-state programming, following FIG. 17E, where a same bit combination (C0 from FIG. 16A) is used for an inhibit mode for all data states, as a comparative example. After the C-state cells pass the VvC verify level, the LDL and QDL bits for the C-state are flipped to 1.

FIG. 17G depicts another option for the bit combinations in the data latches after a C-state memory cell passes a first verify test, following FIG. 17E, where a first bit combination (C7 from FIG. 16A) is used to set a temporary lockout mode for a C-state cell. The QDL bit for the C-state is flipped to 1.

FIG. 17H depicts an option for the bit combinations in the data latches after a C-state memory cell passes an additional verify test, or after soft programming is performed, where a second bit combination (C0 from FIG. 16A) is used to set a permanent lockout mode for the C-state cell. The LDL bit for the C-state is flipped to 1, following the bit combinations of FIG. 17G.

FIG. 17I depicts an option for the bit combinations in the data latches after a C-state memory cell fails an additional verify test, where a third bit combination (C6 from FIG. 16A) is used to set a soft programming mode for the C-state cell, following FIG. 17G. The QDL bit for the C-state is flipped to 0, and the LDL bit for the C-state is flipped to 1, following the bit combinations of FIG. 17G.

FIGS. 18A and 18B depict bit values in data latches during a programming operation involving two data states, where two bit values are used, as a comparative example, consistent with FIG. 6C. This represents write data which is loaded into the data latches. The QPW latch is not used. FIG. 18A provides original write data at a start of a programming operation, in which the LDL bit is 1 for a cell which is to be programmed to the 1-state, and 0 for a cell which is to be programmed to the 0-state. FIG. 18B depicts the bit combinations of FIG. 18A after the 0-state cells pass the VvSLC verify level. The LDL for the 0-state bit is flipped to 1.

FIG. 19A depicts bit combinations in data latches at a start of a programming operation involving two data states, where one bit combination identifies a memory cell which is to remain in the 1-state and another bit combination identifies a memory cell which is to be programmed to the 0-state.

FIG. 19B depicts bit combinations in data latches after a 0-state memory cell passes a first verify test, following FIG. 19A, where a first bit combination is used to set a temporary lockout mode for the memory cell. This involves flipping the UDL bit to 0 for the 0-state, relative to the bit combinations of FIG. 19A.

FIG. 19C depicts bit combinations in data latches after a 0-state memory cell passes an additional verify test, following FIG. 19B, where a second bit combination is used to set a permanent lockout mode for the 0-state cell. This involves flipping the UDL bit to 1 and the LDL bit to 1 for the 0-state, relative to the bit combinations of FIG. 19B.

FIG. 19D depicts bit combinations in data latches after a 0-state memory cell fails the additional verify test, following FIG. 19B, where a third bit combination is used to set a soft programming mode for the 0-state cell. This involves flipping the LDL bit to 1 relative to the bit combinations of FIG. 19B.

FIG. 20A depicts a process for modifying write data so that noisy cells remain in an erased state. Step 2000 involves receiving write data. For example, this can occur at control circuitry. Step 2001 involves obtaining a noise status of the cells involved in the write. For example, this can involve reading a bit from the latches associated with the memory cells, such as the NDL latch. Another option is for the control circuitry, such as the state machine, to store data which identifies the noisy cells. In practice, the number of noisy cells is expected to be a relatively small fraction of all cells, so that the overhead costs in identifying them will be relatively small. One approach is to store a sequential position of each noisy cell, e.g., the 1st, 985th and 2034th cells along a word line, relative to an end of the word line. Step 2002 is to modify the write data to convert data for noisy cells from their original target data state to the erased state.

As an example, consider one byte of data. i.e., 11010010. Starting from the right hand side, the first two bits to be programmed are 10, corresponding to state C, the next two bits to be programmed are 00, corresponding to state B, the next two bits to be programmed are 01, corresponding to state A, and the next two bits to be programmed are 11, corresponding to state Er. Further, referring to FIG. 2, starting from one end of the word line, assume the cells 210, 211 and 212 are to be programmed to the C, B and A-states, respectively, and cell 213 is to remain in the Er state. Further, assume the cell 210 is noisy but the others are not. In this case, the bits 10 are modified to 00 to provide modified data as: 11010000. This modified data is then provided to the latches and used to program the cells. Essentially, programming of the noisy cells is avoided so that any read errors which might be caused by these cells are avoided.

In one approach, the control maintains a table for each target data state with an identification of cells for which the data is modified. For example, FIG. 20C provides tables which identify cells for which the data is modified, classified by the original target data state. A first table 2020 lists the 2034th cell as being an A-state cell. A second table 2021 lists the 985th cell as being a B-state cell. A third table 2022 lists the 1st cell as being a C-state cell. The tables can be provided in the storage location 115, or in memory cells of the array, such as by using cells in a reserved portion of a word line.

Another option is to not modify the write data but to use the tables to identify the noisy cells and their target data states.

FIG. 20B depicts a process for modifying read data from noisy cells. The steps include reading the cells (step 2010), obtaining a noise status of the cells involved in the read (step 2011) and modifying the read data to convert the data from the noisy cells from the erased state to the original state (step 2012). This modification process can be the reverse of the process of step 2002. For example, the modified data 11010000 is read. The first two bits 00 are associated with the 1st cell. Since the 1st cell is in the table 2022, the bits are changed to 10 to represent the C-state.

The next pairs of bits 00, 01 and 11 are associated with the 2nd, 3rd and 4th cells. Since these cells are not listed in the tables, the bits are not changed. The byte is then 11010010.

Accordingly, it can be seen that, in one embodiment, a method for programming a set of memory cells (205), connected to a word line (WL3) comprises: performing one or more program-verify iterations (PV) in a programming pass, two or more memory cells (210, 211) of the set of memory cells are programmed by the one or more program-verify iterations until the two or more memory cells pass a first verify test; in response to the two or more memory cells passing the first verify test, performing one or more program-verify iterations in the programming pass in which the two or more memory cells are temporarily locked out from programming, the two or more memory cells are subject to one or more additional verify tests while the two or more memory cells are temporarily locked out from programming; based on a result of the one or more additional verify tests, determining that the two or more memory cells comprise a noisy memory cell (210) and a non-noisy memory cell (211); performing one or more program-verify iterations in the programming pass in which the noisy memory cell is further programmed; and permanently locking out the non-noisy memory cell from programming in the programming pass without performing further programming of the non-noisy memory cell.

In another embodiment, a memory device comprises: a set of memory cells (205) connected to a word line (WL3), and a control circuit (100, 110, 112, 114, 116, 150, 160, 165, 192, MC0). The control circuit: performs one or more program-verify iterations in a programming pass, two or more memory cells (210, 211) of the set of memory cells are programmed by the one or more program-verify iterations (PV) until the two or more memory cells pass a first verify test; in response to the two or more memory cells passing the first verify test, performs one or more program-verify iterations in the programming pass in which the two or more memory cells are temporarily locked out from programming, and subjects the two or more memory cells to one or more additional verify tests while the two or more memory cells are temporarily locked out from programming; based on a result of the one or more additional verify tests, determines that the two or more memory cells comprise a noisy memory cell (210) and a non-noisy memory cell (211); performs one or more program-verify iterations in the programming pass in which the noisy memory cell is further programmed; and permanently locks out the non-noisy memory cell from programming in the programming pass without performing further programming of the non-noisy memory cell.

In another embodiment, a method for programming a set of memory cells (205) comprises: in one program-verify iteration of a plurality of program-verify iterations in a programming pass, identifying, among the set of memory cells, memory cells (210, 211) having threshold voltages which exceed a verify voltage (VvAL, VvA, VvA_foggy; VvBL, VvB, VvB_foggy; VvCL, VvC, VvC_foggy; VvSLCL, VvSLC); in a subsequent program-verify iteration of the plurality of program-verify iterations, determining, without further programming the set of memory cells, one memory cell (210) among the set of memory cells for which the threshold voltage has decreased below the verify voltage and another memory cell (211) among the set of memory cells for which the threshold voltage has not decreased below the verify voltage; in response to the determining, soft programming the one memory cell followed by locking out the one memory cell from programming for a remainder of the programming pass; and in response to the determining, locking out from programming, for the remainder of the programming pass, without further programming, the another memory cell.

In another embodiment, a method for programming in a memory device comprises: performing one or more program-verify iterations (PV) in a programming pass, two or more memory cells (210, 211) of the set of memory cells are programmed by the one or more program-verify iterations until the two or more memory cells pass a first verify test, the two or more memory cells have a common target data state; in response to the two or more memory cells passing the first verify test, performing one or more program-verify iterations in the programming pass in which the two or more memory cells are temporarily locked out from programming, the two or more memory cells are subject to one or more additional verify tests while the two or more memory cells are temporarily locked out from programming; based on a result of the one or more additional verify tests, determining that the two or more memory cells comprise a noisy memory cell (210) and a non-noisy memory cell (211); and storing data identifying the noisy memory cell and the non-noisy memory cell.

In another embodiment, a memory device comprises: a set of memory cells (205), a storage location (115, 194-197) associated with the set of memory cells, and a control circuit (100, 110, 112, 114, 116, 150, 160, 165, 192, MC0). The control circuit: performs one or more program-verify iterations in a programming pass, two or more memory cells (210, 211) of the set of memory cells are programmed by the one or more program-verify iterations until the two or more memory cells pass a first verify test, the two or more memory cells have a common target data state; in response to the two or more memory cells passing the first verify test, perform one or more program-verify iterations in the programming pass in which the two or more memory cells are temporarily locked out from programming, the two or more memory cells are subject to one or more additional verify tests while the two or more memory cells are temporarily locked out from programming; based on a result of the one or more additional verify tests, determine that the two or more memory cells comprise a noisy memory cell (210) and a non-noisy memory cell (211); and store data in the storage location identifying the noisy memory cell and the non-noisy memory cell.

In another embodiment, a method for programming a set of memory cells (205) comprises: during one programming pass of a multi-pass programming operation, performing a first verify test which indicates that a threshold voltage of a memory cell (210) of the set of memory cells exceeds a verify voltage (VvAL, VvA, VvA_foggy; VvBL, VvB, VvB_foggy; VvCL, VvC, VvC_foggy; VvSLCL, VvSLC) of the first verify test and performing an additional verify test which indicates that the threshold voltage of the memory cell does not exceed a verify voltage of the additional verify test; storing data indicating that the memory cell is noisy, based on the first verify test and the additional verify test; and during an additional programming pass of the multi-pass programming operation, accessing the data and performing a verify test which is based on the data.

Corresponding methods, systems and computer- or processor-readable storage devices for performing the methods provided herein are provided.

The foregoing detailed description has been presented for purposes of illustration and description. It is not intended to be exhaustive or limited to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

We claim:

1. A method for programming a set of memory cells connected to a word line, comprising:
performing one or more program-verify iterations in a programming pass, two or more memory cells of the set of memory cells are programmed by the one or more program-verify iterations until the two or more memory cells pass a first verify test;
in response to the two or more memory cells passing the first verify test, performing one or more program-verify iterations in the programming pass in which the two or more memory cells are temporarily locked out from programming, the two or more memory cells are subject to one or more additional verify tests while the two or more memory cells are temporarily locked out from programming;

based on a result of the one or more additional verify tests, determining that the two or more memory cells comprise a noisy memory cell and a non-noisy memory cell;

performing one or more program-verify iterations in the programming pass in which the noisy memory cell is further programmed; and permanently locking out the non-noisy memory cell from programming in the programming pass without performing further programming of the non-noisy memory cell.

2. The method of claim 1, wherein:
the noisy memory cell is identified as being noisy based on a threshold voltage of the noisy memory cell decreasing over time by any amount or by at least a specified amount, as detected by the one or more additional verify tests and the first verify test; and
the non-noisy memory cell is identified as being non-noisy based on a threshold voltage of the non-noisy memory cell not decreasing over time by any amount or by at least the specified amount, as detected by the one or more additional verify tests and the first verify test.

3. The method of claim 1, further comprising:
after the further programming of the noisy memory cell, permanently locking out the noisy memory cell from programming in the programming pass.

4. The method of claim 1, wherein:
the one or more additional verify tests comprise a plurality of additional verify tests; and
the method further comprises: based on result of the plurality of additional verify tests, determining a degree to which the noisy memory cell is noisy, an amount of the further programming of the noisy memory cell is based on the degree to which the noisy memory cell is noisy.

5. The method of claim 1, wherein:
the two or more memory cells pass the first verify test in an nth program-verify iteration of the one or more program-verify iterations, where n>=1; and
the further programming comprises a soft programming in which a bit line voltage for the noisy memory cell is higher than a bit line voltage for the noisy memory cell in the nth program-verify iteration.

6. The method of claim 5, wherein:
a program voltage applied to the word line during the soft programming is higher than a program voltage applied to the word line during the nth program-verify iteration.

7. The method of claim 5, further comprising:
storing data indicating a level of the bit line voltage during the nth program-verify iteration; and
setting the bit line voltage during the soft programming based on the data.

8. The method of claim 5, wherein:
the bit line voltage is adjusted based on a target data state of the noisy memory cell.

9. The method of claim 1, wherein the two or more memory cells pass the first verify test in an nth program-verify iteration of the one or more program-verify iterations, where n>=1, one set of data latches is associated with the noisy memory cell and another set of data latches is associated with the non-noisy memory cell, the method further comprising:
during the nth program-verify iteration, providing a bit combination in the one set of data latches and in the another set of data latches indicating that the two or more memory cells are to be programmed to a target data state;

during the one or more program-verify iterations in which the two or more memory cells are temporarily locked out from programming and are subject to one or more additional verify tests, providing a bit combination in the one set of data latches and in the another set of data latches indicating that the two or more memory cells are temporarily locked out from programming; and during the one or more program-verify iterations in which the noisy memory cell is further programmed, providing a bit combination in the one set of data latches indicating that the noisy memory cell is to be further programmed, and providing a bit combination in the another set of data latches indicating that the non-noisy memory cell is to be permanently locked out from further programming.

10. The method of claim 1, wherein:
a number m of program-verify iterations in the one or more program-verify iterations in which the two or more memory cells are temporarily locked out from programming is a function of a target data state of the two or more memory cells.

11. The method of claim 1, wherein:
the two or more memory cells pass the first verify test in an nth program-verify iteration of the programming pass; and
a number m of program-verify iterations in the one or more program-verify iterations in which the two or more memory cells are temporarily locked out from programming is a function of the number n, where n>=1.

12. The method of claim 1, wherein:
a number of program-verify iterations in the one or more program-verify iterations in which the two or more memory cells are temporarily locked out from programming is a function of a programming progress of the set of memory cells.

13. The method of claim 1, wherein:
a sense parameter for the noisy memory cell is different during a verify test of the one or more additional verify tests, than during the first verify test.

14. The method of claim 13, wherein:
the sense parameter which is different comprises at least one of a sense time used by a sense circuit, a reference current used by the sense circuit and a verify voltage applied to the word line.

15. The method of claim 13, wherein:
the sense parameter is stricter during the verify test of the one or more additional verify tests, than during the first verify test.

16. A memory device, comprising:
a set of memory cells connected to a word line; and
a control circuit, the control circuit:
performs one or more program-verify iterations in a programming pass, two or more memory cells of the set of memory cells are programmed by the one or more program-verify iterations until the two or more memory cells pass a first verify test;

in response to the two or more memory cells passing the first verify test, performs one or more program-verify iterations in the programming pass in which the two or more memory cells are temporarily locked out from programming, and subjects the two or more memory cells to one or more additional verify tests while the two or more memory cells are temporarily locked out from programming;

based on a result of the one or more additional verify tests, determines that the two or more memory cells comprise a noisy memory cell and a non-noisy memory cell;

performs one or more program-verify iterations in the programming pass in which the noisy memory cell is further programmed; and permanently locks out the non-noisy memory cell from programming in the programming pass without performing further programming of the non-noisy memory cell.

17. The memory device of claim 16, wherein the control circuit:

identifies the noisy memory cell as being noisy based on a threshold voltage of the noisy memory cell decreasing over time by any amount or by at least a specified amount, as detected by the one or more additional verify tests and the first verify test; and identifies the non-noisy memory cell as being non-noisy based on a threshold voltage of the non-noisy memory cell not decreasing over time by any amount or by at least the specified amount, as detected by the one or more additional verify tests and the first verify test.

18. The memory device of claim 16, wherein:

the two or more memory cells pass the first verify test in an nth program-verify iteration of the one or more program-verify iterations, where n>=1; and the further programming comprises a soft programming in which a bit line voltage for the noisy memory cell is higher than a bit line voltage for the noisy memory cell in the nth program-verify iteration.

19. A method for programming a set of memory cells, comprising:

in one program-verify iteration of a plurality of program-verify iterations in a programming pass, identifying, among the set of memory cells, memory cells having threshold voltages which exceed a verify voltage;

in a subsequent program-verify iteration of the plurality of program-verify iterations, determining, without further programming the set of memory cells, one memory cell among the set of memory cells for which the threshold voltage has decreased below the verify voltage and another memory cell among the set of memory cells for which the threshold voltage has not decreased below the verify voltage;

in response to the determining, soft programming the one memory cell followed by locking out the one memory cell from programming for a remainder of the programming pass; and in response to the determining, locking out from programming, for the remainder of the programming pass, without further programming, the another memory cell.

20. The method of claim 19, wherein:

during the soft programming, a bit line voltage associated with the one memory cell is higher than during the one program-verify iteration.

21. The method of claim 19, wherein:

in the subsequent program-verify iteration, a program voltage is applied to a word line connected to the set of memory cells and bit line voltages associated with the memory cells are set at a level which prevents programming.

22. The method of claim 19, wherein:

the soft programming occurs in a program-verify iteration of the plurality of program-verify iterations which is after the subsequent program-verify iteration.

* * * * *